United States Patent [19]
Kubota

[11] Patent Number: 5,592,012
[45] Date of Patent: Jan. 7, 1997

[54] MULTIVALUED SEMICONDUCTOR READ ONLY STORAGE DEVICE AND METHOD OF DRIVING THE DEVICE AND METHOD OF MANUFACTURING THE DEVICE

[75] Inventor: Yasushi Kubota, Sakurai, Japan

[73] Assignee: Sharp Kabushiki Kaisha, Osaka, Japan

[21] Appl. No.: 558,977

[22] Filed: Nov. 13, 1995

Related U.S. Application Data

[63] Continuation of Ser. No. 222,812, Apr. 5, 1994, abandoned.

[30] Foreign Application Priority Data

Apr. 6, 1993 [JP] Japan .................. 5-079907
Jun. 30, 1993 [JP] Japan .................. 5-162045

[51] Int. Cl.⁶ .......................... H01L 29/76; H01L 29/94
[52] U.S. Cl. .................. 257/391; 257/392; 365/104
[58] Field of Search .................. 257/391, 390, 257/392; 365/104

[56] References Cited

U.S. PATENT DOCUMENTS 4,467,520  8/1984  Shiotari ........................ 257/391
4,837,181  6/1989  Galbiati et al. ................ 257/391

FOREIGN PATENT DOCUMENTS 58-209155  12/1983  Japan .
3-4559    1/1991   Japan .
4-88671   3/1992   Japan .

*Primary Examiner*—Ngân V. Ngô
*Attorney, Agent, or Firm*—Nixon & Vanderhye

[57] ABSTRACT

In a four-valued read only storage device, each of memory cells arrayed in matrix form at intersections of word lines and bit lines has four metal oxide semiconductor (MOS) transistors. The four MOS transistors have different combinations of two channel impurity profiles and two effective channel lengths in correspondence with storage data. Either data corresponding to the channel impurity profile or data corresponding to the effective channel length is read out from a memory cell by controlling a gate voltage and a drain voltage to be applied to a selected MOS transistor in the memory cell.

12 Claims, 24 Drawing Sheets

MULTIVALUED SEMICONDUCTOR READ ONLY STORAGE DEVICE AND METHOD OF DRIVING THE DEVICE AND METHOD OF MANUFACTURING THE DEVICE

This is a continuation of application Ser. No. 08/222,812, filed Apr. 5, 1994, now abandoned.

BACKGROUND OF THE INVENTION

1. Field of the Invention

The present invention relates to a multivalued read only storage device (mask ROM) capable of storing multivalued data represented by plural bits, a method of driving the device, and a method of manufacturing the device.

2. Description of the Prior Art

Almost all the currently available read only storage devices are designed for storing binary data (one-bit data) in each memory cell.

However, in order to achieve a higher packing density, it is effective to store multivalued data, which is represented by plural bits, in each memory cell. Research on such read only storage devices adapted to store multivalued data has been carried out and several reports have been made.

FIG. 1 shows a memory cell group in one of such read only storage devices. In this read only storage device, each memory cell group is composed of four MOS (Metal-Oxide-Semiconductor) field-effect transistors (each referred to as the "MOSFET" hereinafter) TR0, TR1, TR2, and TR3 wherein storage data is written by implanting impurities in the channel regions. The impurity concentrations of the channel regions of the four MOSFET's are different from each other, so that the MOSFET's have different threshold voltages. More specifically, except for an impurity implanted in an entire active region of the substrate for adjusting the threshold voltage of the transistors, no impurity is implanted in the channel region of the MOSFET TR0, and impurities are implanted in the channel regions of the other MOSFET's TR1, TR2 and TR3 to form three different kinds of implant regions IR1, IR2 and IR3, respectively. As described above, the channel impurity concentrations of the implant regions differ from each other such that the MOSFET's TR0, TR1, TR2 and TR3 have different threshold voltages according to their respective storage data. In FIG. 1, "BL" indicates a bit line, "WL" indicates a word line, "GND" indicates a ground line, and "C" indicates a contact. The word lines WL constitute gate electrodes, the bit lines BL constitute drain electrodes and the ground line GND constitutes a source electrode.

In a method of driving the read only storage device of FIG. 1 for readout of storage data from a memory cell, a gate voltage (a biased electric potential applied to the word line WL) to be applied to a MOSFET TR0, TR1, TR2, TR3 to be selected is varied in three levels. Four-valued data is obtained by deciding as to which of the three gate voltages has caused the MOSFET to turn on. FIG. 2 shows a circuit for driving the read only storage device of FIG. 1 to read out storage data therefrom by this method. The circuit of FIG. 2 has a clock 50 which generates timing signals T1, T2, T3 of three different voltages respectively, a word line driver 51 for controlling the potentials of the word lines WL in the memory cell array S0, three latches 52, 53 and 54 for latching output from a selected memory cell, three differential amplifiers 55, 56 and 57 to which are inputted respective reference potentials Vref1, Vref2, and Vref3 and output from the respective latches 52, 53 and 54, and a decoder 58. The timing signals T1–T3 of three different voltage levels are applied to a given word line WL as the gate voltage.

In view of the fact that the MOSFET's exhibit different drive powers with respect to the same gate voltage, there is another reading method using a constant gate voltage. According to this method, four-valued data is achieved by applying a constant gate voltage to the MOSFET, evaluating a voltage drop across the bit line based on the magnitude of the drain current, and comparing the value of the voltage drop with three different reference voltages. FIG. 3 shows a circuit for driving the read only storage device of FIG. 1 to read storage data out by this reading method.

The circuit of FIG. 3 has a word line driver 61 for controlling the potentials of the word lines WL in the memory cell array, three differential amplifiers 62, 63 and 64 receiving different reference voltages vref1, vref2 and Vref3 respectively as one of inputs, and a decoder 65. Resistors R1 and R2 are connected in series between each bit line BL and a power source $V_{DD}$. When data is read out, the word line driver 61 applies a given voltage (gate voltage) to the word line WL. The drain current is determined corresponding to a MOSFET TR0, TR1, TR2, TR3 which is turned on by the gate voltage, and the voltage drop at a point P between the resistors R1 and R2 is determined corresponding to the drain current. The differential amplifiers 62, 63 and 64 compare a voltage at the point P with the reference voltages Vref1, Vref2 and Vref3 respectively, and the decoder 65 analyzes the outputs from the differential amplifiers 62, 63 and 64, resulting in obtainment of a four-valued data.

FIG. 4 shows a memory cell group of another read only storage device adapted to store multivalued data. As shown in FIG. 4, each memory cell group of this read only storage device has four MOSFET's TR4, TR5, TR6 and TR7 which have different channel widths to have different drive powers in correspondence with storage data. Reading of storage data from the read only storage device of FIG. 4 is executed by a circuit as shown in FIG. 3.

The aforementioned read only storage devices, however, have the following problems.

In the read only storage device shown in FIG. 1, the four MOSFET's TR0, TR1, TR2, and TR3 have different channel impurity concentrations. More specifically, the MOSFET TR0 has been subjected to no channel impurity implantation, the MOSFET TR1 has been subjected to only a first channel impurity implantation, the MOSFET TR2 has been subjected to only a second channel impurity implantation, and the MOSFET TR3 has been subjected to both the first and second channel impurity implantation. Production of the read only storage device of such an arrangement requires at least two masking (photolithography) steps and ion implantation steps in addition to the normal process of manufacturing the binary read only storage device. The increase in the number of steps of the manufacturing process causes reduction of the yield of the products. Furthermore, in manufacturing the read only storage device of FIG. 1, the channel impurity concentrations must be controlled so as to obtain threshold voltages corresponding to the four different storage data with good reproducibility. However, according to the growing trend of applying a lower voltage to the device, the margin in setting the threshold voltages reduces. For instance, in a device operating on a power voltage of 3 V, it is required to set four threshold voltages within the voltage range of about 3 V, which means that obtainment of the threshold voltages with high reproducibility is becoming more and more difficult.

When the driving method adopted in the circuit shown in FIG. 2 is used in reading storage data from the read only storage device, the gate voltage to be applied to the MOSFET TR0, TR1, TR2, TR3 is varied in three different levels (timing signals T1, T2, and T3 are applied as the three different gate voltages), which means that the gate voltage control is complicated. It is difficult to control a time to decide as to which voltage has turned the MOSFET on, and therefore it is difficult to increase the read rate. Furthermore, since the decision of the ON/OFF state of a MOSFET is effected with respect to every gate voltage (T1, T2, T3), time required for the decisions increases when the decisions are executed serially. On the other hand, when the decisions are executed in parallel, plural (three) decision circuits are required. In this case, the size of the device including the peripheral circuit becomes large.

When reading of storage data is executed by the circuit shown in FIG. 3, data are obtained by evaluating the voltage drop at the point P between the resistors R1 and R2 from the magnitude of the drain current and comparing a value of the voltage drop with the three reference voltages (Vref1, Vref2, and Vref3). In this case, the comparison cannot be executed until the dropped voltage is sufficiently stabilized, which requires a long read time. Furthermore, since the decision of data must be carried out plural (three) times, time required for the decisions increases if the decisions are executed serially. On the other hand, if the decisions are executed in parallel, plural number of decision circuits are required. This causes an increase in size of the device including the peripheral circuit.

In the case of the read only storage device shown in FIG. 4, the four MOSFET's TR4, TR5, TR6, and TR7 have different channel widths. Among the channel widths, the minimum channel width (the channel width of the MOSFET TR6) is determined by the process conditions. Since the size of the memory cell depends on the dimensions of the MOSFET TR4 having the maximum channel width, a rather great area is required for each memory cell. Therefore, even though the read only storage device stores multivalued data in each memory cell, the high integration effect is reduced. Furthermore, in the read only storage device of FIG. 4, the channel width of each MOSFET is varied according to the storage data, and the written data corresponds to the physical width of the active region. Therefore, writing of the data is carried out in the time of processing the LOCOS formation. This requires a long turnaround time for the device manufacture.

When storage data is read out from the read only storage device of FIG. 4 by the circuit as shown in FIG. 3, the same problems as described above occur.

SUMMARY OF THE INVENTION

An object of the present invention is therefore to provide an improved multivalued read only storage device readable at a high speed and capable of securing an increased margin for the manufacturing process without increasing the occupation area or size of the device, and reducing the turnaround time for the device manufacture.

Another object of the present invention is to provide a method of driving the read only storage device as defined above.

A further object of the present invention is to provide a method of manufacturing the read only storage device as defined above.

in order to accomplish the above object, in a multivalued read only storage device according to the present invention, each of memory cells arrayed in matrix form at intersections of word lines and bit lines comprises a plurality of metal oxide semiconductor (MOS) transistors and each memory cell group has a plurality of channel impurity profiles and a plurality of effective channel lengths for the MOS transistors in the memory cell. Each MOS transistor has one of the channel impurity profiles and one of the effective channel lengths in correspondence to storage data.

According to the present invention, reading of the storage data can be controlled by the gate voltage and the drain voltage applied to each of the MOS transistors.

In regard to the channel impurity profiles of the MOS transistors, each MOS transistor may have a channel impurity profile making the transistor a depletion type transistor or a channel impurity profile making the transistor an enhancement type transistor, or each MOS transistor may have an impurity profile making the transistor an enhancement type transistor having a high threshold or an impurity profile making the transistor an enhancement type transistor having a low threshold.

When the MOS transistors are made to have two types of effective channel length: a length which causes a punch-through phenomenon and a length which does not cause the punch-through phenomenon, the two effective channel lengths can be a normal channel length and a shorter channel length causing the punch-through phenomenon. Accordingly, possible increase of the occupation area of the memory cells is prevented.

To obtain a four-valued memory cell, it is required to provide only two types of channel impurity profiles and two types of effective channel lengths so as to provide four different types of MOS transistor, and therefore a greater process margin can be assured in comparison with the aforementioned conventional four-valued memory cell. This feature allows the yield to increase and cost reduction to be achieved.

The read only storage device of the present invention allows multivalued storage data to be read therefrom by independently turning on or off each MOSFET by means of signals applied to the word line (gate electrode) and the bit line (a drain electrode) of each MOSFET. Since an output signal takes a binary value of '1' or '0', the time required for the output signal to be stabilized at a level capable of being subject to decision can be reduced. Furthermore, for the decision, the output signal from the memory cell is compared with only a single reference value. Therefore it is possible to shorten a read time and increase a read rate.

The signals given to the gate electrode and the drain electrode as bias voltages can be controlled by one bit within an address signal given from outside.

The four MOS transistors may be connected in parallel or in series. When the four MOS transistors are connected in series, each memory cell further comprises a selector transistor for selecting the memory cell.

In an embodiment, the four MOS transistors and the selector transistor are driven by a common word line, wherein one terminal of each of the MOS transistors is connected to a different bit line and the other terminal of each of the MOS transistors is connected to a terminal of the selector transistor, the other terminal of the selector transistor being grounded. Data of a MOS transistor in each memory cell is read out by selecting a word line in the memory cell and a bit line connected to the MOS transistor. When a plurality of bit lines, one per memory cell, are selected, a plurality of data can be read in parallel. Therefore, the read time per bit is further reduced and a still higher read speed can be achieved.

Furthermore, since only one selector transistor is provided for a plurality of memory cell transistors in each memory cell group, the occupation area or size of the device can be suppressed in comparison with the case where one selection transistor is provided for every memory cell transistor. Therefore, the device can be put into practical use.

The channel impurity profile and the effective channel length can be set after the formation of the gate electrodes. In this case, the turnaround time in the manufacturing process can be reduced. The turnaround time for the ROM manufacture is normally defined as a time required from a data write step to the completion of the device.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The following describes several embodiments of the present invention with reference to the attached drawings.

First embodiment

Figure 5:
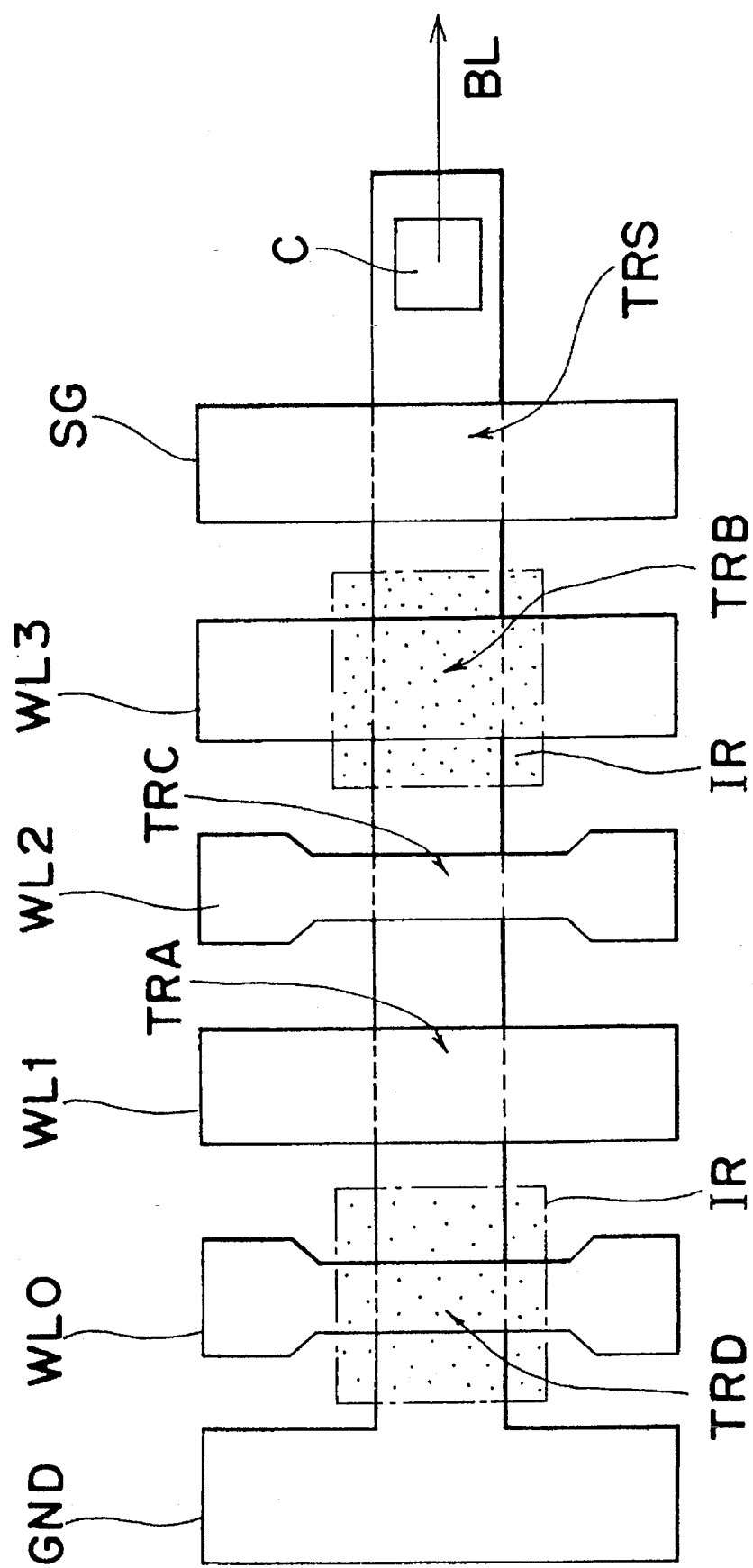
FIG. 5 is a diagram showing the construction of a memory cell of a multivalued read only storage device in accordance with a first embodiment of the present invention.

FIG. 5 is a diagram showing the construction of a memory cell group of a semiconductor read only storage device in accordance with a first embodiment of the present invention, wherein the memory cell group has a NAND type structure. In the NAND type memory cell group, contact portions C for connecting a metal wire with diffusion layers (source and drain regions) are reduced in number by serially connecting a plurality of (normally four or eight) transistors and providing a selector gate for selecting a memory cell, whereby an increase in packing is achieved.

The read only storage device has an array of memory cells each of which has a MOS transistor and, as shown in FIG. 5, four MOSFET's TRA, TRB, TRC, and TRD constitute a memory cell group. The MOSFET TRA is an enhancement type transistor having a long channel (simply referred to as "long-channel enhancement type transistor"), the MOSFET TRB is a depletion type transistor having a long channel (simply referred to as "long-channel depletion type transistor"), the MOSFET TRC is an enhancement type transistor having a short channel (simply referred to as "short-channel enhancement type transistor"), and the MOSFET TRD is a depletion type transistor having a short channel (simply referred to as "short-channel depletion type transistor"). That is, each memory cell group has two different types of channel impurity profile and two different types of physical channel length (effective channel length). A dotted area IR in the figure is an implant region where an impurity has been doped by the ion implantation method to provide a depletion type transistor. Bias conditions to be applied to each word line WL (WL0, WL1, WL2, WL3) and the bit line BL are set according to an address given from outside as described later to read one of two different types of information ("1" or "0") written in each MOSFET. In the memory cell, the word lines WL serve as gate electrodes, the bit line BL serves as a drain electrode and the ground line GND serves as a source electrode. In FIG. 5, "SG" indicates a selector gate (a word line) for driving a selector transistor TRS to select the memory cell.

FIGS. 9A, 9B, 9C and 9D respectively show the current characteristics of the long-channel enhancement type transistor TRA, the long-channel depletion type transistor TRB, the short-channel enhancement type transistor TRC, and the short-channel depletion type transistor TRD. These figures also show the current characteristics of transistors in a memory cell in a second embodiment, as described later. In these figures, the drain current $I_D$ (the axis of ordinates) of each MOSFET is shown relative to the drain voltage $V_D$ (the axis of abscissas) and the gate voltage (curves) $V_G$.

The following is evident from FIGS. 9A through 9D. In the long-channel enhancement type transistor TRA, a current flows when the gate voltage is at a high level and a potential difference exists between the source and the drain. In the long-channel depletion type transistor TRB, a current flows when the gate voltage is not at a negative level and a potential difference exists between the source and the drain. In the short-channel enhancement type transistor TRC, a current flows when the gate voltage is at a high level or a potential difference between the source and the drain is not lower than a specified level (about 3 V). In the short-channel depletion type transistor TRD, a current flows when the gate voltage is not at a negative level or the potential difference between the source and the drain is than a specified level.

Table 1 shows a relation between the ON/OFF state of each MOSFET and the bias conditions for the word lines WL and the bit line BL.

TABLE 1

|  |  | $V_G = 5$ V | $V_G = 0$ V $V_D = 2$ V | $V_G = -2$ V $V_D = 5$ V |
|---|---|---|---|---|
| TRA: | Enhancement type long channel | ON | OFF | OFF |
| TRB: | Depletion type long channel | ON | ON | OFF |
| TRC: | Enhancement type short channel | ON | OFF | ON |
| TRD: | Depletion type short channel | ON | ON | ON |

Although the exemplified voltages are based on a power voltage of 5 V in Table 1, it is preferred to apply optimum voltages according to process conditions and device characteristics.

As is evident from Table 1, the ON/OFF state of each MOSFET can be controlled according to the bias conditions of the word line WL and the bit line BL.

Figure 11:
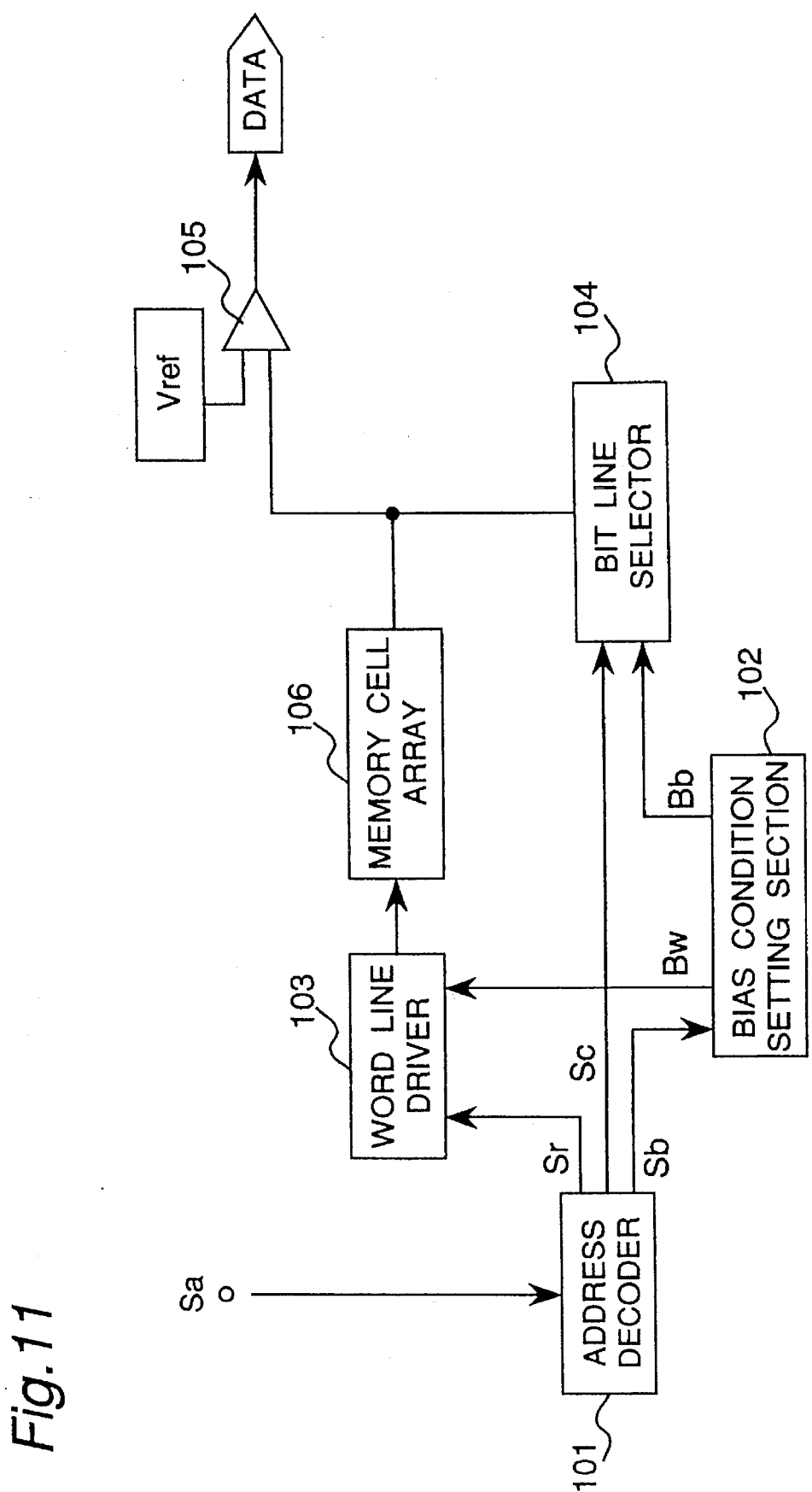
FIG. 11 is a block diagram of a read circuit for driving the read only storage devices of the present invention.

The multivalued read only storage device having an array of the memory cells shown in FIG. 5 is driven by a read circuit having a construction as shown in FIG. 11 wherein the memory cell array is indicated by reference numeral 106. The read circuit has an address decoder 101, a bias condition setting section 102, a word line driver 103, a bit line selector 104, and a differential amplifier 105. When an input address signal "Sa" of several bits is transmitted, the address decoder 101 analyzes the signal transition and provides a signal "Sr" representing a row address and a signal "Sc" representing a column address to the word line driver 103 and the bit line selector 104 respectively while outputting a single given bit "Sb" of the input address signal Sa to the bias condition setting section 102. The given bit Sb used for the bias conditions setting can be any one of the upper or lower bits constituting the address signal, although use of the most significant bit or the least significant bit is most practical. In the bias condition setting section 102, the bias conditions (values of $V_G$ and $V_D$) to be applied to a selected word line WL and a selected bit line BL are set based on the one bit Sb received from the decoder 101. In this embodiment, when the bit Sb assumes a value of zero (0), the electric potential $V_G$ of a word line WL to be selected is set at 0 V, and the potential $V_D$ of a bit line BL to be selected is set at 2 V. On the other hand, when the bit Sb assumes a value of one (1), the electric potential $V_G$ of a word line BL to be selected is set at -2 V, and the electric potential $V_D$ of a bit line to be selected is set at 5 V. The former conditions ($V_G=0$ V, $V_D=2$ V) are conditions to read data written in the form of a threshold voltage (channel impurity profile), that is, data specified by the threshold voltage, while the latter conditions ($V_G=-2$ V, $V_D=5$ V) are conditions to read data written in the form of a channel length, that is, data specified by the channel length. Then the bias condition setting section 102 outputs signals "Bw" and "Bb" representing the bias conditions to the word line driver 103 and the bit line selector 104, respectively. In response to the respective signals Bw and Bb from the bias condition setting section 102, the word line driver 103 and the bit line selector 104 applies bias voltages to the selected word line WL (for example, WL0) and the selected bit line BL. To the other word lines WL (for example, WL1–WL3) is applied such a high bias voltage as can turn on all the memory cell MOSFET's, and further the high bias voltage is also applied to the selector gate SG. A data signal thus read on the bit line from the selected transistor (for example, TRD) is compared with a reference voltage (Vref) in the differential amplifier 105.

Thus by selecting the bias conditions based on one of the bits constituting the address signal Sa, two different types of data can be read from an identical memory cell, which allows a four-value (2-bit) memory cell to be implemented.

since the read only storage device of this embodiment requires only one reference voltage Vref for comparison in the decision stage, only one decision circuit is required and, in addition, there is no need to serially execute a plurality of decisions. The above allows the device to be a multivalued read only storage device which offers a high read speed and requires a small peripheral circuit including a circuit for decision.

The following describes the fabrication process of the above-mentioned read only storage device with reference to FIGS. 12A–12H. Although the fabrication process shown in these figures is for forming n-channel MOSFET's, p-channel MOSFET's can be used instead. The following process is basically similar to a commonly used CMOS device fabrication process with the exception that this fabrication process requires an additional step of ion implantation into a channel region for varying the channel impurity concentration in accordance with data to be written.

Figure 12A:
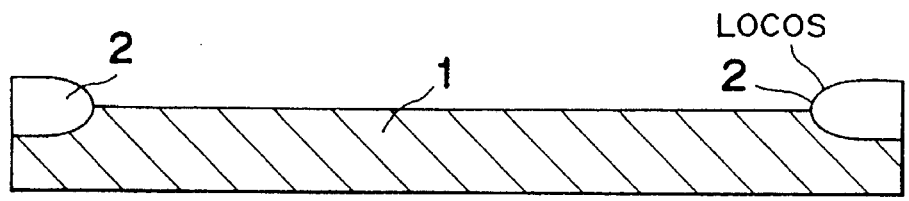
FIGS. 12A, 12B, 12C, 12D, 12E, 12F, 12G and 12H illustrate fabrication steps for the read only storage device of the first embodiment.

First, a well formation process is effected on a p-type silicon substrate 1 in a known manner, and then a field insulation film 2 is formed by a LOCOS (LOCal Oxidation of Silicon) method to isolate elements, as shown in FIG. 12A.

Figure 12B:
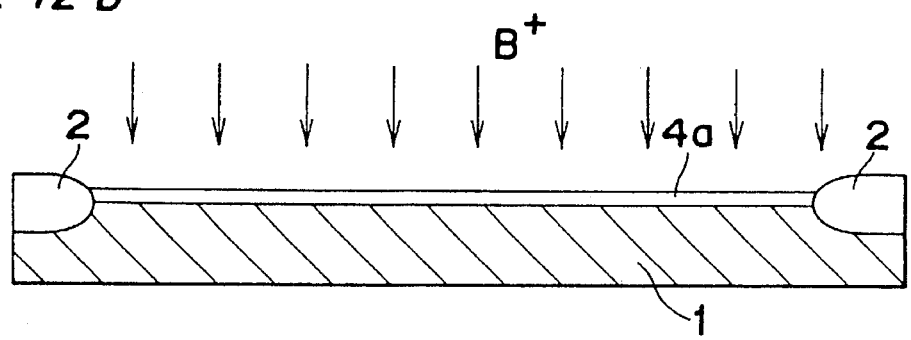

Then, as shown in FIG. 12B, an oxide film 4a is formed on an active region of the substrate 1 as a protection film against ion implantation. Then, p-type impurity ions are implanted into the substrate 1 in the implantation condition of 20 keV and $1 \times 10^{12}$ cm$^{-2}$ to give a desired threshold voltage to the enhancement type memory transistors TRA, TRC and TRS to be formed. Boron is used as the p-type impurity in this example.

Figure 12C:
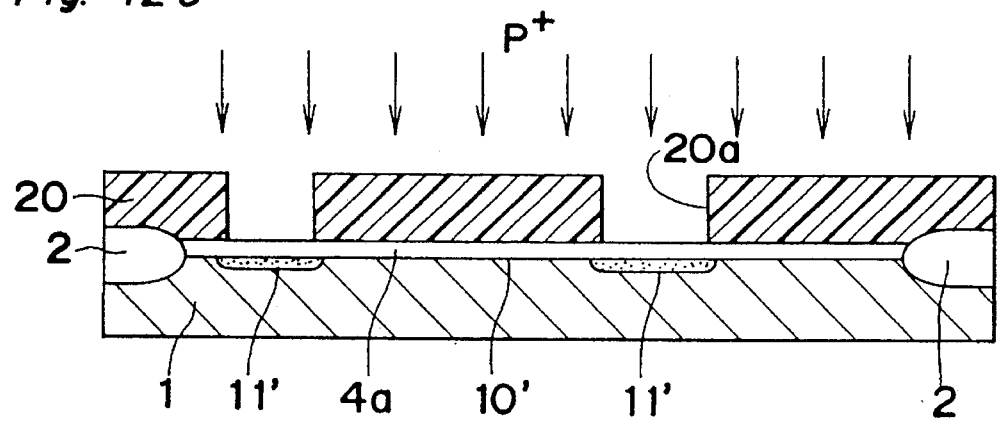

Then, as shown in FIG. 12C, a resist pattern 20 is formed on the oxide film 4a. The resist pattern 20 is formed with openings 20a in positions corresponding to regions 11' in which channels 11 (see FIGS. 13E–13G) of the depletion type transistors TRB and TRD are to be formed. Then, ion-implantation of an impurity is carried out. An impurity different from the impurity of the substrate 1 is used to obtain the predetermined threshold voltage of the depletion type transistors. In this embodiment, phosphor is used. Phosphor ions are implanted into the substrate 1 through the openings 20a of the resist pattern 20 serving as a mask under the implantation condition of 60 keV and $2 \times 10^{12}$ cm$^{-2}$. Thus, the implant regions 11' (corresponding to the regions IR in FIG. 5) offering the channels 11 of the depletion type transistors are formed. At this ion-implantation step shown in FIG. 12C, no impurity is implanted in regions 10' of the substrate 1 in which channels 10 of the enhancement type transistors TRA, TRC and TRS are formed.

Figure 12D:
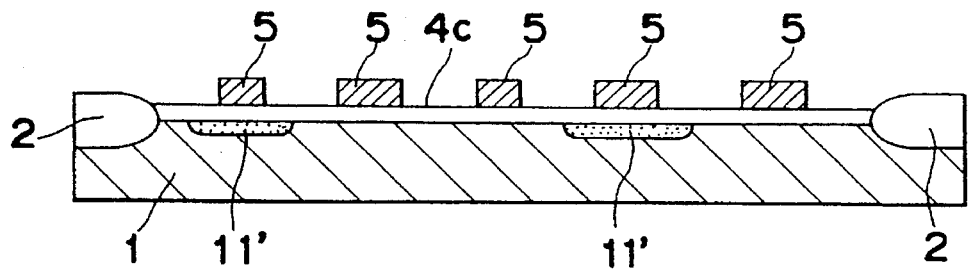

Subsequently, the resist pattern 20 and the oxide film 4a are removed. Thereafter, as shown in FIG. 12D, a gate oxide film, that is, insulation film 4c is formed on the exposed surface of the substrate 1 by a thermal oxidation method, and then gate electrodes 5 to be the word lines WL0–WL3 and the selector gate SG are formed of polysilicon containing an impurity at a high concentration by a known technique. The widths of the gate electrodes 5 are determined in correspondence with the effective channel lengths of the corresponding MOSFET's.

Figure 12E:
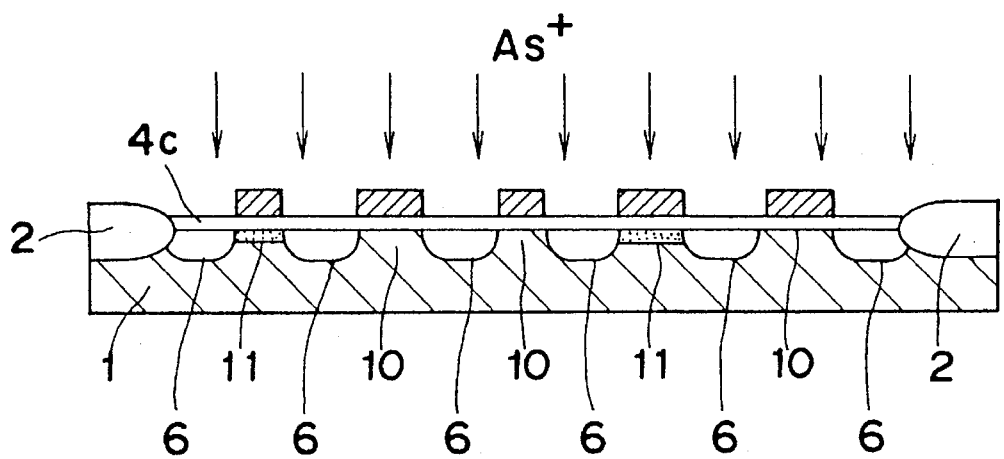

Then, as shown in FIG. 12E, arsenic ions are implanted into the substrate 1 using the gate electrodes 5 as a mask, whereby regions 6 serving as sources or drains are formed. The implantation condition here is 50 keV (implantation energy) and $3 \times 10^{15}$ cm$^{-2}$ (ion dose). The type of the impurity used in this ion implantation step differs from the type of the impurity of the p-type substrate 1 such that n-channel transistors are formed. Phosphorus may be used instead of arsenic. By the formation of the source/drain regions 6, channel regions 10, 11 having different effective channel lengths are established. When a transistor having an LDD (Lightly Doped Drain) structure is to be formed, it is required to effect shallow implantation of an impurity prior to the ion implantation step of FIG. 12E.

Figure 12F:
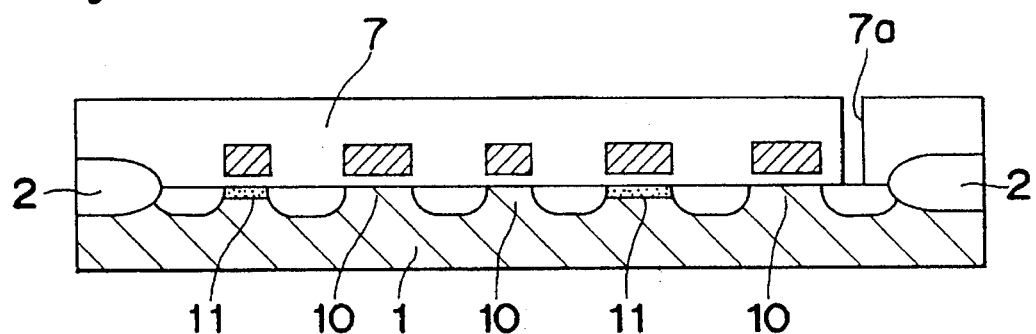

Then, as shown in FIG. 12F, an insulation film 7 principally made of silicon dioxide is deposited on the substrate 1 and then contact holes 7a are formed in the insulation film 7 for connecting the MOSFET's with a bit line which is formed in the subsequent step.

Figure 12G:
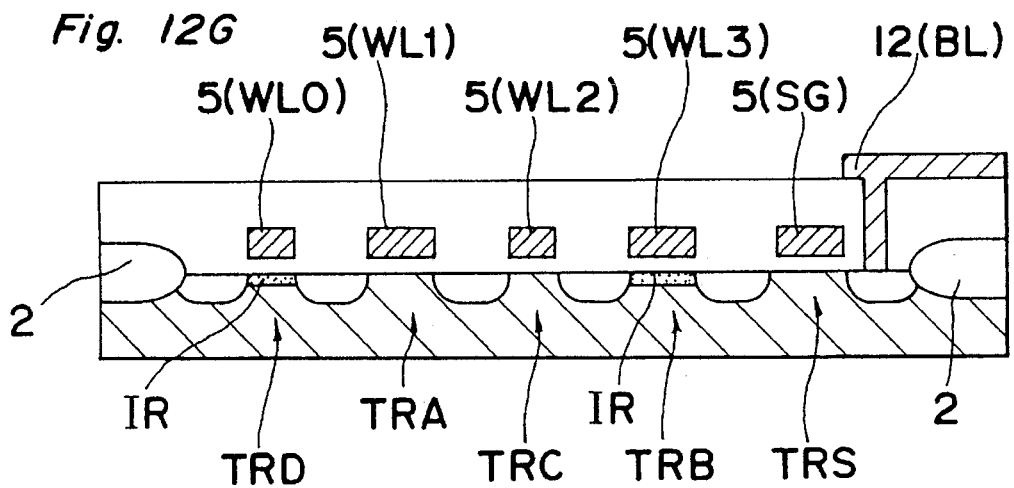

The bit line 12 is formed of a metal principally made of aluminum or the like, as shown in FIG. 12G. Thus, the fabrication of the read only storage device having the memory cell transistors TRA–TRD, the selector transistor TRS, the word lines WL0–WL3, the selector gate SG, and the bit line BL is completed. The ground line GND is not shown in FIG. 12G.

Figure 12H:
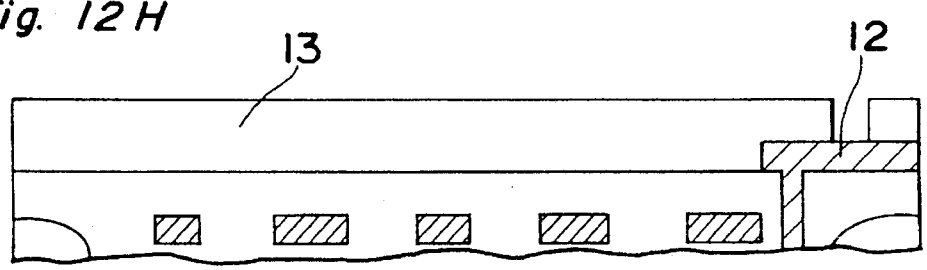

After the bit line 12 is formed, a protection film 13 may be deposited at need as shown in FIG. 12H. In this case a pad section is opened in the protection film 13.

Since the above-mentioned read only storage device has only two channel impurity profiles, that is, two threshold voltages (the depletion type transistors and the enhancement type transistors) and only two effective channel lengths (a channel length that causes the punch-through phenomenon and a channel length that does not causes the punch-through phenomenon), an increased process margin can be assured, when compared with the conventional prior art multivalued read only storage device that has four different threshold voltages and the multivalued read only storage device that has four different channel widths. Further, since reading from a memory cell group can be executed by deciding whether a selected MOSFET of the memory cell group is ON or OFF, there is no need to discriminate a very small signal difference (voltage difference or current difference) in contrast to the practice in the conventional multivalued read only storage devices. Therefore, a wide margin can be assured in the read stage. Furthermore, there is no need to wait until the signal level is stabilized, which leads to reduction in read time.

Second embodiment

Figure 6:
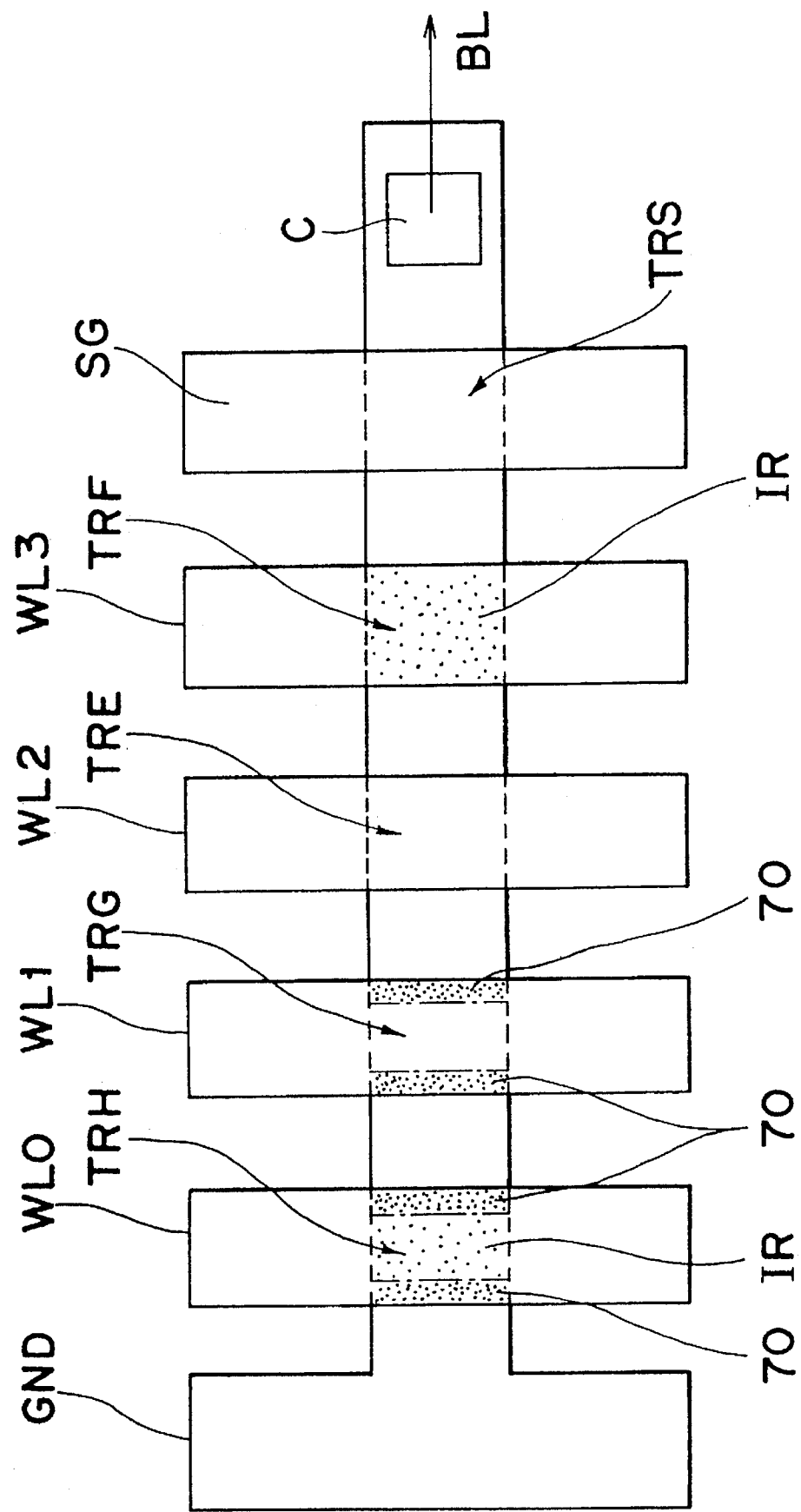
FIG. 6 is a diagram showing the construction of a memory cell of a multivalued read only storage device in accordance with a second embodiment of the present invention.

FIG. 6 is a diagram showing the construction of a memory cell group of a read only storage device in accordance with a second embodiment of the present invention.

Similar parts in FIGS. 5 and 6 are indicated in the same reference numbers and a detailed description on such parts are omitted here. The memory cell group has a NAND type structure as in the first embodiment. The memory cell group has the following four MOSFET's: a long-channel enhancement type transistor TRE, a long-channel depletion type transistor TRF, a short-channel enhancement type transistor TRG, and a short-channel depletion type transistor TRH.

In the present embodiment, the two different types of channel impurity profile are provided by varying the channel impurity concentration. Furthermore, the two different effective channel lengths are provided by further implanting an impurity in portions of the channel region and using the implant portions as part of the source and drain regions. In this respect, the second embodiment is different from the first embodiment.

The long-channel enhancement type transistor TRE, the long-channel depletion type transistor TRF, the short-channel enhancement type transistor TRG, and the short-channel depletion type transistor TRH have the same current characteristics as those of the transistors TRA, TRB, TRC and TRD, respectively, which are shown in FIGS. 9A, 9B, 9C and 9D.

That is, as shown in FIGS. 9A–9D, in the long-channel enhancement type transistor TRE, a current flows when the gate voltage is at a high level and a potential difference exists between the source and the drain. In the long-channel depletion type transistor TRF, a current flows when the gate voltage is not at a negative level and a potential difference exists between the source and the drain. In the short-channel enhancement type transistor TRG, a current flows when the gate voltage is at a high level or a potential difference between the source and the drain is not lower than a specified level (about 3 V, for example). In the short-channel depletion type transistor TRH, a current flows when the gate voltage is not at a negative level or the potential difference between the source and the drain is not lower than a specified level.

Table 2 shows a relation between the ON/OFF state of each MOSFET and the bias conditions for the word lines WL and the bit line BL.

TABLE 2

|  |  | $V_G = 5$ V | $V_G = 0$ V $V_D = 2$ V | $V_G = -2$ V $V_D = 5$ V |
|---|---|---|---|---|
| TRE: | Enhancement type long channel | ON | OFF | OFF |
| TRF: | Depletion type long channel | ON | ON | OFF |
| TRG: | Enhancement type short channel | ON | OFF | ON |
| TRH: | Depletion type short channel | ON | ON | ON |

Although the exemplified voltages are based on a power voltage of 5 V in Table 2, it is preferred to apply optimum voltages according to process conditions and device characteristics.

As is evident from Table 2, the ON/OFF state of each MOSFET is controlled according to the bias conditions for the word lines and the bit line.

The read only storage device of this embodiment can be driven in the same manner as in the first embodiment by the read circuit of FIG. 11 and storage multivalued data is read out from a selected memory cell.

The following describes the fabrication process of the read only storage device of this embodiment with reference to FIGS. 13A–13H. Although n-channel MOSFET are formed herein as the MOSFET's constituting a memory cell group, it is acceptable to form p-channel MOSFET's. The fabrication process described below is basically a commonly adopted CMOS fabrication process, although, as compared with the common CMOS device fabrication process, the present fabrication process requires an additional implantation step (a step for varying the channel impurity concentration) for a channel region and an additional implantation step (a step for varying the effective channel length) for the source and drain regions in correspondence with data to be written. Note that similar parts in FIGS. 12A–12H and FIGS. 13A–13H are designated by the same reference numbers.

Figure 13:
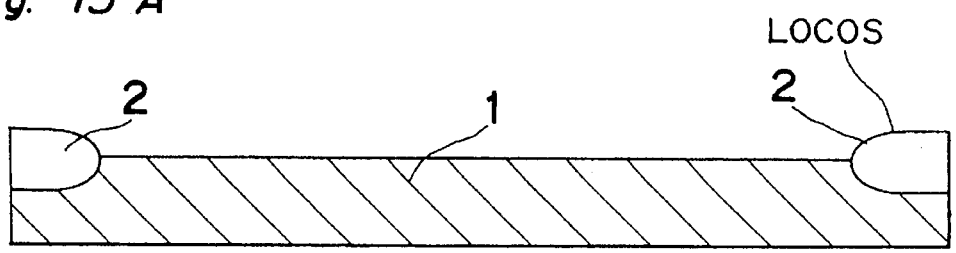
FIGS. 13A, 13B, 13C, 13D, 13E, 13F, 13G, and 13H illustrate fabrication steps for the read only storage device of the second embodiment.
Figure 13:
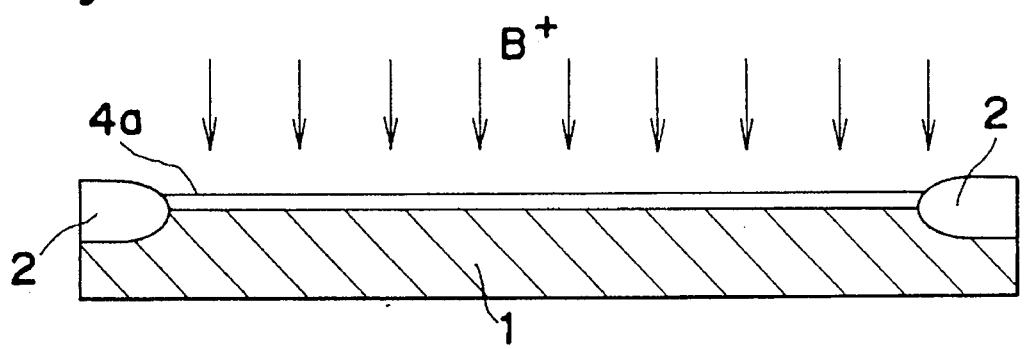
Figure 13:
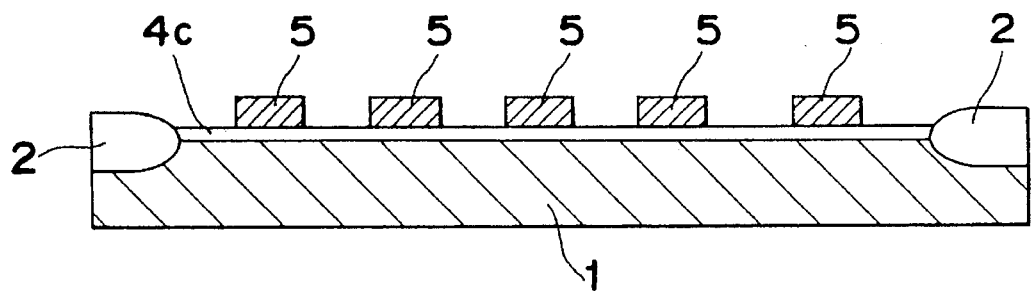
Figure 13:
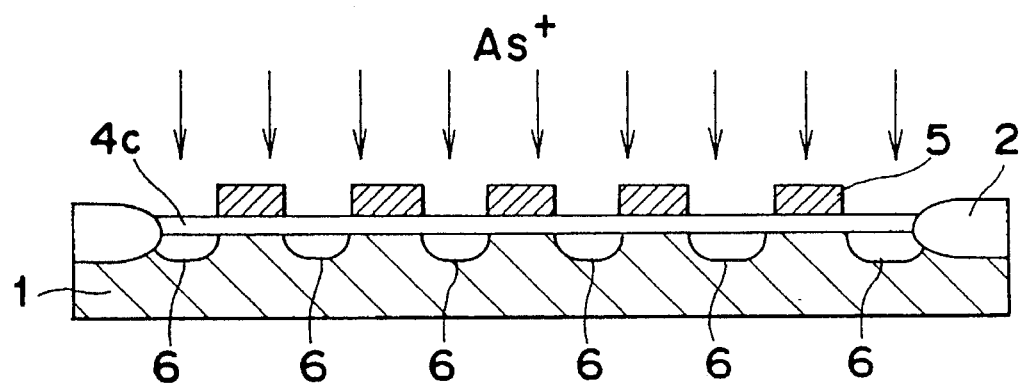

First, a well formation process is effected on a p-type silicon substrate 1 in a known manner, and then a field insulation film 2 is formed by a LOCOS (LOCal Oxidation of Silicon) method to isolate elements, as shown in FIG. 13A.

Then, as shown in FIG. 13B, an oxide film 4a is formed on an active region of the substrate 1 as a protection film against ion implantation. Then, p-type impurity ions are implanted into the substrate 1 under the implantation condition of 20 keV and $1\times10^{12}$ cm$^{-2}$ to give a desired threshold voltage to the n-channel enhancement type transistors TRE, TRG and TRS to be formed. Boron is used as the p-type impurity in this example. After the implantation of boron ions is completed, the protection film 4a is removed.

Thereafter, as shown in FIG. 13C, an insulation film, that is, gate oxide film, 4c is formed on the substrate 1 by a thermal oxidation method, and then gate electrodes 5 to be the word lines WL0–WL3 and selector gate SG are formed of polysilicon containing an impurity at a high concentration. In this example, all the gate electrodes 5 are processed to have the same width.

Then, as shown in FIG. 13D, arsenic ions are implanted in the substrate 1 using the gate electrodes 5 as a mask, so that the source and drain regions 6 are formed in self alignment. The implantation condition here is 50 keV and $2\times10^{15}$ cm$^{-2}$ In this step, phosphor can be also used as the impurity. Note that when it is desired to form a transistor having an LDD (Lightly Doped Drain) structure, it is required to effect shallow implantation of an impurity prior to the implantation step of FIG. 13D. Up to this stage, the process is a normal CMOS fabrication process.

Figure 13E:
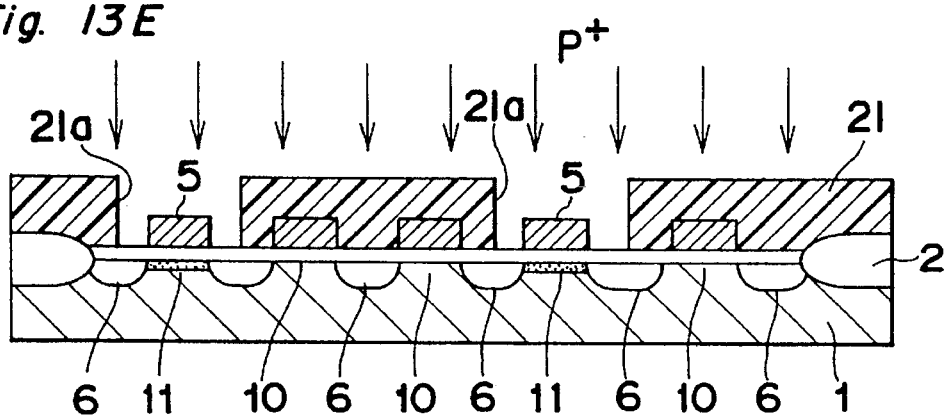

Then, as shown in FIG. 13E, a resist pattern 21 is formed on the gate oxide film 4c and the gate electrodes 5. The resist pattern 21 is formed with openings 21a in positions corresponding to regions of the substrate in which the depletion type transistors TRF and TRH are to be formed. Then, using the resist pattern 21 as a mask, implantation of phosphorus ions is effected under the conditions of 180 key and $3\times10^{12}$ cm$^{-2}$ such that the impurity ions reach down to portions (the channel regions 11 of the depletion type transistors) of the substrate 1 beneath the gate electrodes 5. At this step, an impurity (phosphor in the present embodiment) whose type is different from that of the impurity implanted in the substrate 1 is used to reduce the threshold voltage of the transistors and obtain the depletion type transistors TRF and TRH. At this ion-implantation step shown in FIG. 13E, no impurity is implanted in channel regions 10 of the substrate 1 for the enhancement type transistors TRE, TRG and TRS.

Thus, the channel regions 10 and 11 having different impurity concentrations are formed.

Figure 13F:
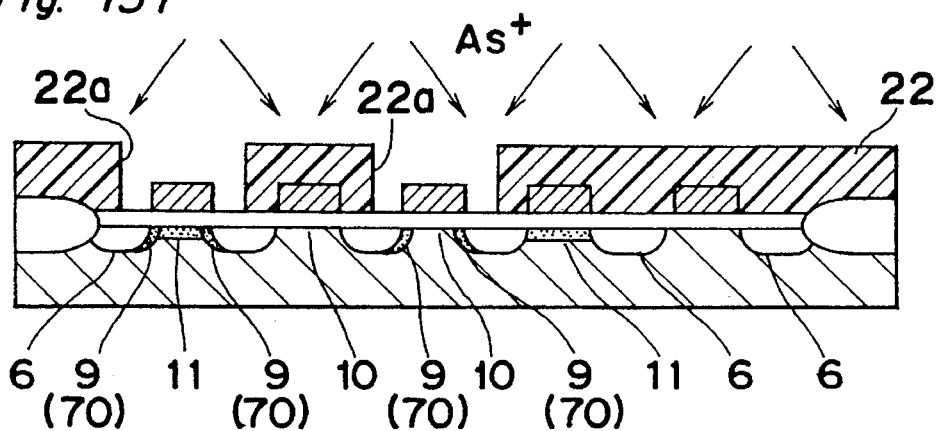

After the resist pattern 21 is removed, a new resist pattern 22 is formed as shown in FIG. 13F. The resist pattern 22 is provided with openings 22a at portions corresponding to the substrate portions where the transistors TRE and TRH having a short effective channel length are to be formed. Then, using the resist pattern 22 as a mask, an impurity is implanted at an oblique angle of 30°–60° with respect to the direction of the normal line of the substrate 1 such that the impurity is implanted in substrate portions 9 beneath the gate electrodes 5. The impurity that is used in this ion implantation process is of the same type as that implanted in the source/drain regions 6. In this embodiment, arsenic ions are implanted under the implantation conditions of 50 keV and $2\times10^{15}$ cm$^{-2}$. Phosphorus may be used instead. The portions 9 become part of the source/drain regions, so that a shorter effective channel length is offered. Thus, channel regions 10 and 11 having different effective channel lengths are provided. Note that the oblique ion implantation should be done in a plurality of directions (at least two directions) such that the memory cell group MOSFET's in symmetrical positions have uniform characteristics. Alternatively, the oblique ion implantation may be carried out while the substrate 1 is being turned. Both the oblique angle at which the impurity is implanted and the implantation conditions (an ion dose and implantation energy) are determined such that a desired short effective channel length (which causes the punch-through phenomenon in the corresponding MOSFET) is offered.

Figure 13G:
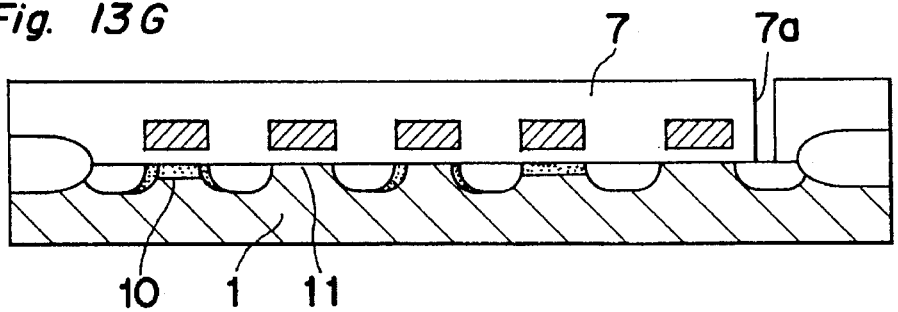

Then, the resist pattern 22 is removed and, as shown in FIG. 13G, an insulation film 7 principally made of silicon dioxide is formed in the same manner as in the first embodiment, and a contact hole 7a for connecting the transistors in the memory cell group with a bit line is processed in the insulation film 7.

Figure 13H:
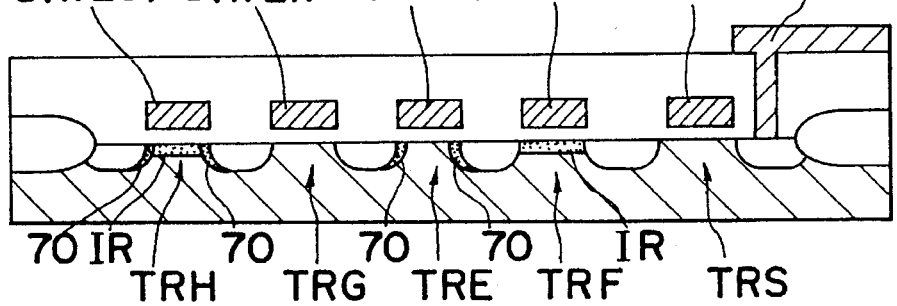

Then, as shown in FIG. 13H, the bit line 12 is formed by means of a metal principally made of aluminum or the like, and the fabrication of the multivalued read only device having the transistors TRE–TRH and TRS, the word lines WL0–WL3, the selector gate SG, and the bit line BL is completed. The ground line GND is not shown in FIG. 13H.

A protection film 13 may be deposited on the insulation film 7 and the bit line 12 and pad sections 13a are formed in the protection film, as described in connection with the fabrication process of the first embodiment and shown in FIG. 12H.

According to the present embodiment, it is not necessary to vary the widths of the gate electrodes 5 in accordance with the different channel lengths. In other words, data is written after the gate electrodes have been formed. Therefore, it is possible to shorten turnaround time for the device fabrication, when compared with the first embodiment wherein the gate electrodes are processed to have two different widths and part of data is written when the gate electrodes are formed.

Since the read only storage device of the second embodiment has two different channel impurity concentrations (the depletion type and the enhancement type) and two different effective channel lengths (a length that causes the punch-through phenomenon, and a length that does not cause it), a sufficient process margin can be assured.

The read only storage device can be driven by the read circuit of FIG. 11, similarly to the first embodiment. Since reading from a memory cell group can be executed by deciding whether a selected memory cell MOSFET is ON or OFF, there is no need to discriminate a very small signal difference (potential difference or current difference) in contrast to the practice in the conventional multivalued read only storage device. Therefore, a wide margin can be assured for the read operation. Furthermore, there is no need to wait until the signal level is stabilized, which leads to reduction in read time.

Third embodiment

Figure 7:
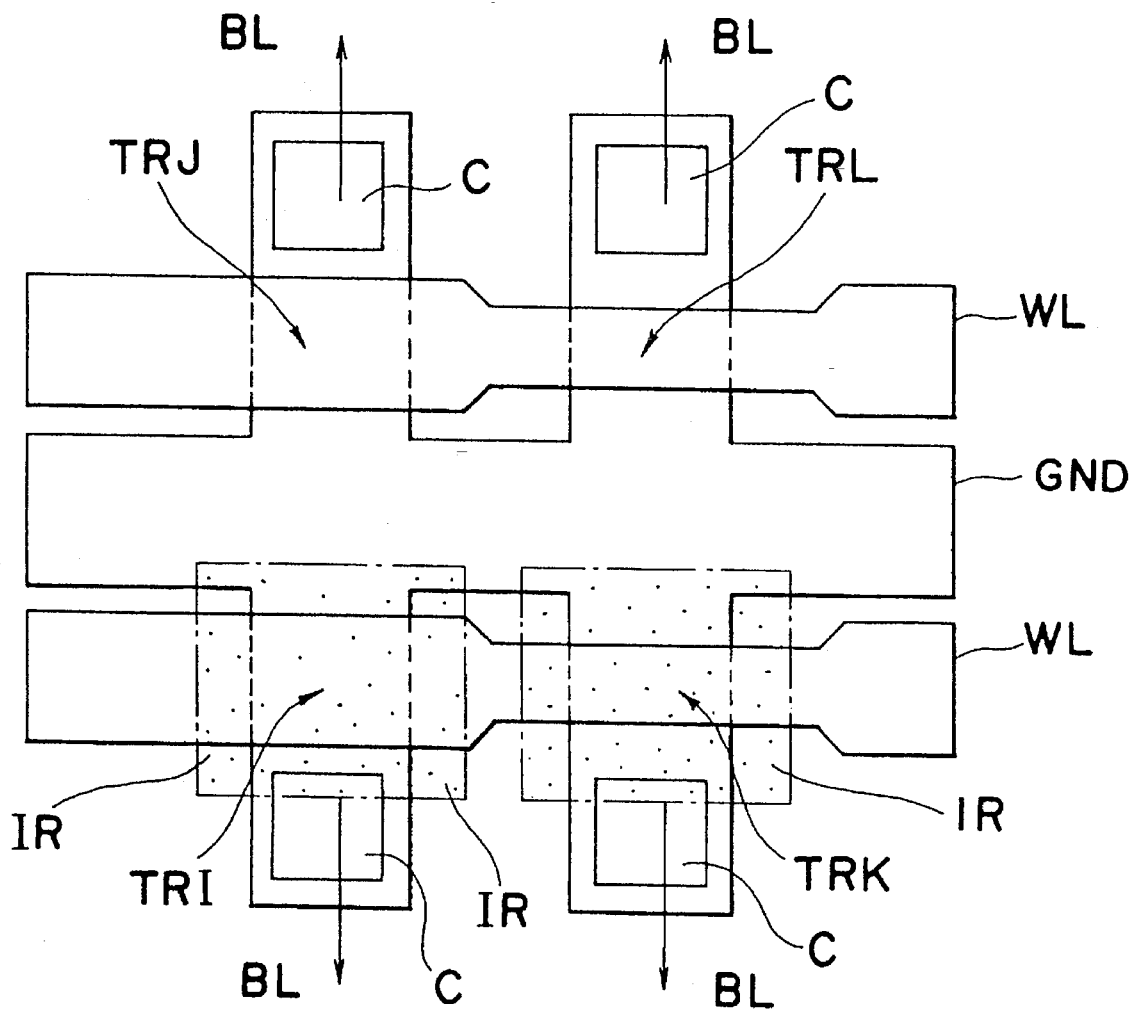
FIG. 7 is a diagram showing the construction of a memory cell of a multivalued read only storage device in accordance with a third embodiment of the present invention.

FIG. 7 is a diagram showing the construction of a memory cell group of a semiconductor read only storage device in accordance with a third embodiment of the present invention. In the present embodiment, the memory cell group has a NOR type structure. In the NOR type memory cell group, an increase in read speed is achieved by connecting a plural number (normally two or four) of transistors in parallel and increasing the conductance between the bit line BL and the ground line GND.

The read only storage device has an array of memory cells wherein the group has, as shown in FIG. 7, four MOSFET's TRI, TRJ, TRK, and TRL, all of which are enhancement type transistors. The MOSFET TRI has a long channel length and a high threshold voltage. The MOSFET TRJ has the long channel length and a low threshold. The MOSFET TRK has a short channel length and the high threshold. The MOSFET TRL has the short channel length and the low threshold. That is, each memory cell group has two different channel impurity profiles (concentrations) and two different physical channel lengths (effective channel lengths) in combination. A dotted area IR in the figure is an implant region where an impurity has been implanted to provide the high threshold voltage.

FIGS. 10A, 10B, 10C and 10D respectively show the current characteristics of the long-channel high-threshold enhancement type transistor, the long-channel low-threshold enhancement type transistor, the short-channel high-threshold enhancement type transistor, and the short-channel low-threshold enhancement type transistor of the present embodiment. In these figures, the drain current $I_D$ (the axis of ordinates) of each MOSFET is plotted relative to the drain voltage $V_D$ (the axis of abscissas) and the gate voltage (curves) $V_G$.

Figure 10A:
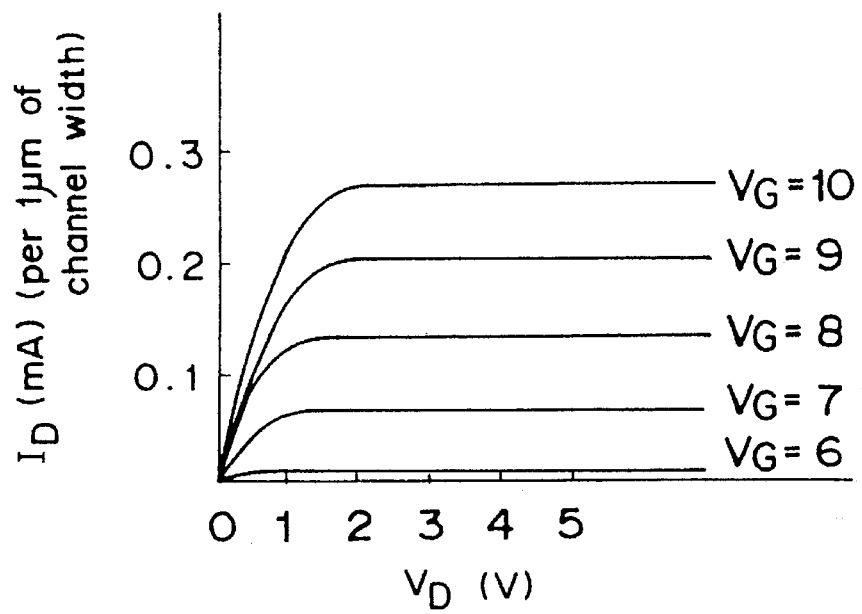
FIGS. 10A, 10B, 10C and 10D are graphs showing the current characteristics of the memory cell MOSFET's in the third and fourth embodiments.

As evident from FIG. 10A, in the long-channel high-threshold transistor TRI, no current flows when the gate voltage $V_G$ is not greater than the power voltage (5 V in this embodiment), regardless of the bias condition $V_D$ between the source and the drain.

Figure 10B:
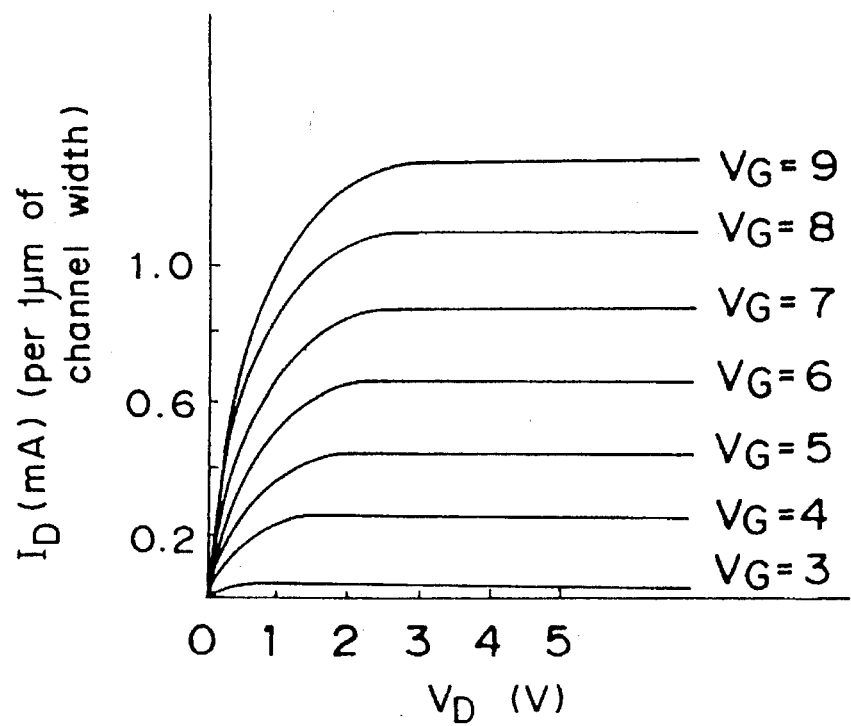

As indicated by FIG. 10B, in the long-channel low-threshold transistor TRJ, a current flows when the gate voltage $V_G$ is am a high level, regardless of the potential difference $V_D$ between the source and the drain.

Figure 10C:
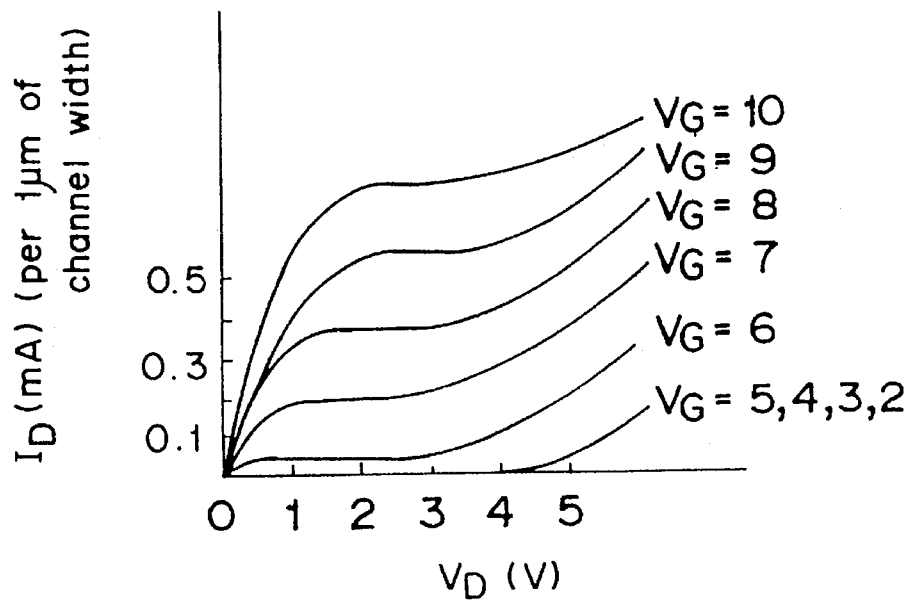

As indicated by FIG. 10C, in the short-channel high-threshold transistor TRK, a current flows when the potential difference $V_D$ between the source and the drain is higher than a certain level (about 4 V) regardless of the gate voltage $V_G$.

Figure 10D:
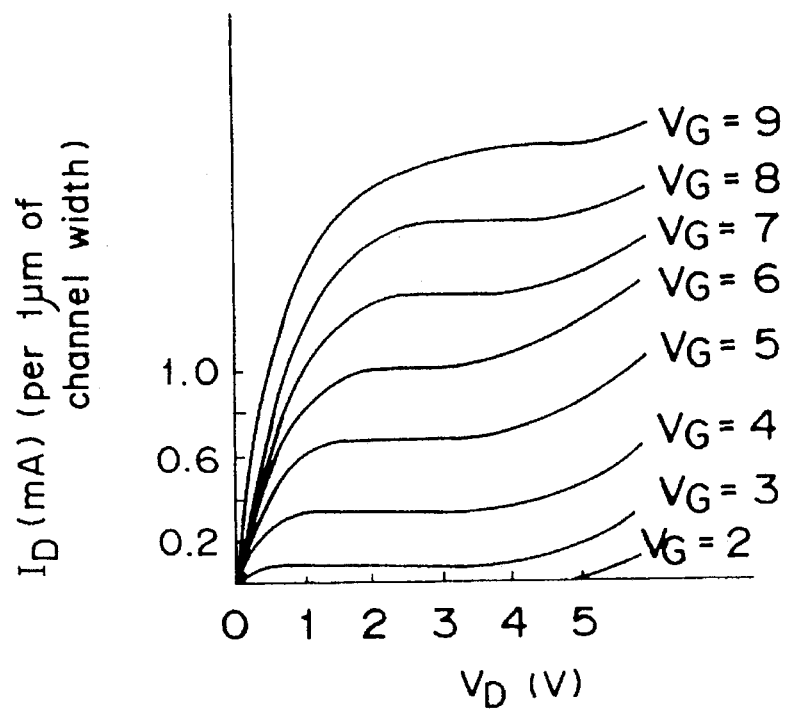

As is obvious from FIG. 10D, in the short-channel low-threshold transistor TRL, a current flows when the gate voltage $V_G$ is at a high level or the potential difference $V_D$ between the source and the drain is higher than a certain level (between 4 V and 5 V).

When the gate voltage $V_G$ is 0 V and the potential difference $V_D$ between the source and the drain is lower than a specified level, no current flows in any memory cell MOSFET.

Table 3 shows a relation between the ON/OFF state of each MOSFET and the bias conditions for the word lines WL and the bit lines BL.

TABLE 3

|  |  | $V_G = 0$ V<br>$V_D = 2$ V | $V_G = 5$ V<br>$V_D = 2$ V | $V_G = 2$ V<br>$V_D = 5$ V |
|---|---|---|---|---|
| TRI: | High threshold voltage long channel | OFF | OFF | OFF |
| TRJ: | Low threshold voltage long channel | OFF | ON | OFF |
| TRK: | High threshold voltage short channel | OFF | OFF | ON |
| TRL: | Low threshold voltage short channel | OFF | ON | ON |

Although the exemplified voltages are based on a power voltage of 5 V in Table 3, it is preferred to apply optimum voltages according to process conditions and device characteristics.

As is evident from Table 3, the ON/OFF state of each MOSFET can be controlled according to the bias conditions for the word line and the bit line.

Similar to the preceding embodiments, the multivalued read only storage device having an array of the memory cells shown in FIG. 7 is driven by a read circuit having a construction as shown in FIG. 11. Specifically, when an input address signal "Sa" of several bits transits, the address decoder 101 analyzes the signal transition and provides a signal "Sr" representing a row address and a signal "Sc" representing a column address to the word line driver 103 and the bit line selector 104 respectively while outputting a given bit "Sb" of the input address signal to the bias condition setting section 102. The given bit Sb used for the bias conditions setting can be any one of the upper or lower bits constituting the address signal, although use of the most significant bit or the least significant bit is most practical. In the bias condition setting section 102, the bias conditions (values of $V_G$ and $V_D$) to be applied to a selected word line WL and a selected bit line BL are set up based on the given bit Sb received from the decoder 101. In this embodiment, when the given bit Sb of the address signal Sa assumes a value of zero (0), the electric potential $V_G$ of a word line WL to be selected is set at 5 V, and the potential $V_D$ of a bit line BL to be selected is set at 2 V. On the other hand, when the given bit Sb of the address signal Sa assumes a value of one (1), the electric potential $V_G$ of a word line BL to be selected is set at 2 V, and the electric potential $V_D$ of a bit line to be selected is set at 5 V. The former conditions ($V_G=5$ V, $V_D=2$ V) are conditions to read data written in the form of a threshold voltage (channel impurity profile), that is, data specified by the threshold voltage, while the latter conditions ($V_G=2$ V, $V_D=5$ V) are conditions to read data written in the form of a channel length, that is, data specified by the channel length. Then the bias condition setting section 102 outputs signals "Bw" and "Bb" representing the bias conditions to the word line driver 103 and the bit line selector 104, respectively. In response to the respective signals Bw and Bb from the bias condition setting section 102, the word line driver 103 and the bit line selector 104 apply bias voltages to the selected word line WL (for example, WL0) and the selected bit line BL. 0 V is applied to the other, not selected word line WL such that MOSFET's connected to the not selected word line are turned off. A data signal thus read on the bit line from the selected transistor (for example, TRL) is compared with a reference voltage (Vref) in the differential amplifier 105.

Thus by selecting the bias conditions in accordance with the single bit Sb in the address signal "Sa", two different types of data can be read from an identical memory cell, which allows a four-valued (2-bit) memory cell to be implemented.

The present read only storage device can be manufactured in a manner similar to that for the first embodiment manufacture shown in FIGS. 12A–12G, although the layout of the memory cell transistors, impurities to be used, implantation conditions, etc. are different. The following description is made only with respect to the ion implantation steps for the present embodiment, using FIGS. 12B, 12C, and 12E for the sake of convenience.

At an ion implantation step corresponding to that shown in FIG. 12B, boron ions are implanted under the conditions of 20 keV and $5\times10^{12}$ cm$^{-2}$ such that n-channel enhancement type transistors are obtained.

At an ion implantation step corresponding to that shown in FIG. 12C, boron ions are implanted under the conditions of 20 keV and $4\times10^{13}$ cm$^{-2}$. Accordingly, implant regions (corresponding to the regions 11') offer a threshold higher than that of the other regions (corresponding to the regions 10').

It is noted that an impurity (boron in the present case) of the same type as that of the impurity of the substrate 1 is used in this ion implantation process to raise the threshold voltage of the transistors to be formed, unlike the ion implantation step of the first embodiment fabrication shown in FIG. 12C wherein an impurity of the type different from that of the impurity of the substrate 1 is used to lower the threshold voltage.

An ion implantation step for fabricating the source and drain regions 6 of this embodiment is the same as that for the first embodiment shown in FIG. 12E. That is, arsenic ions are implanted under the conditions of 50 keV and $3\times10^{15}$ cm$^{-2}$.

It will be obvious that advantages offered by this embodiment are similar to those offered by the preceding embodiments.

Fourth embodiment

Figure 8:
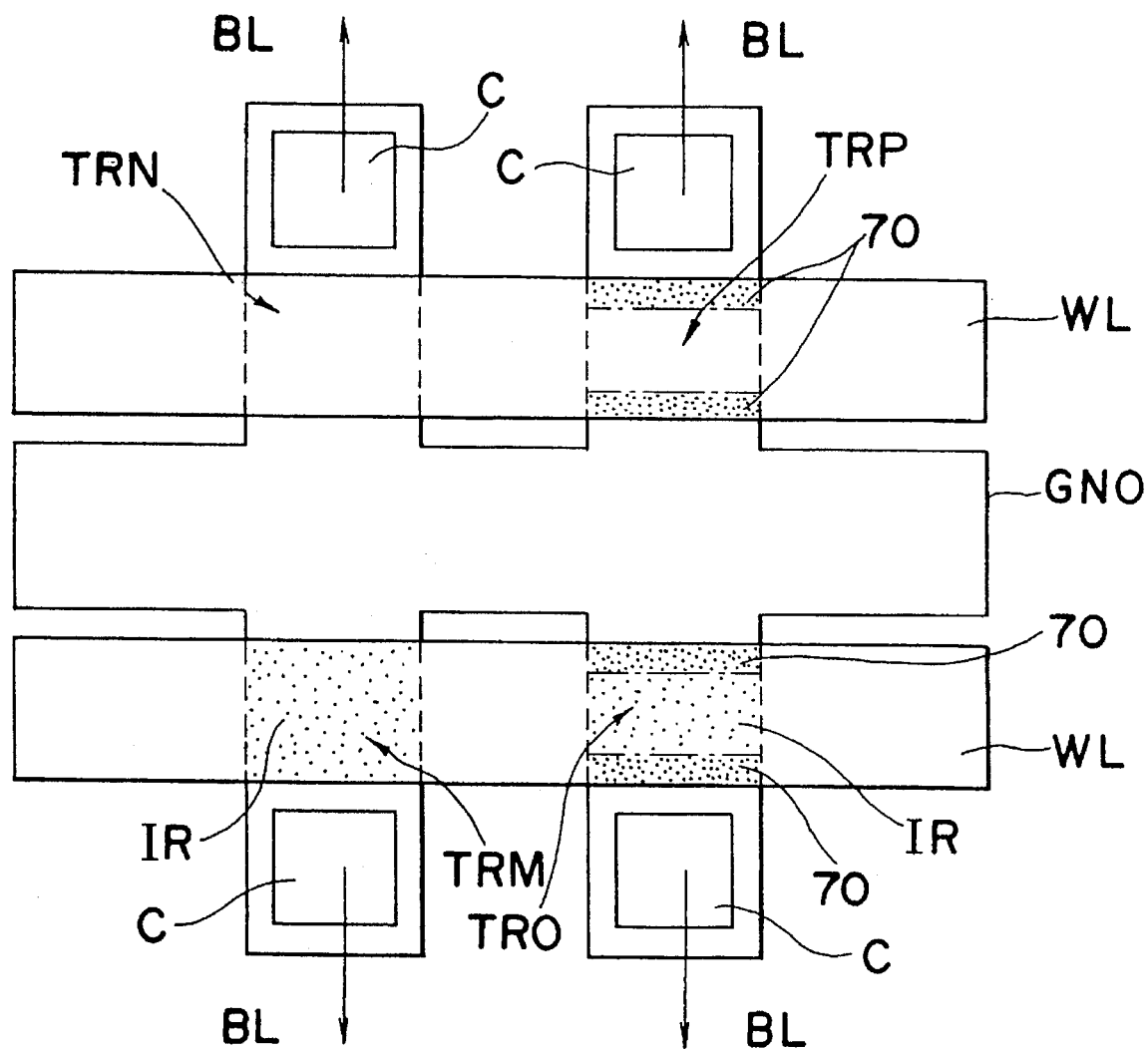
FIG. 8 is a diagram showing the construction of a memory cell of a multivalued read only storage device in accordance with a fourth embodiment of the present invention.
Figure 9A:
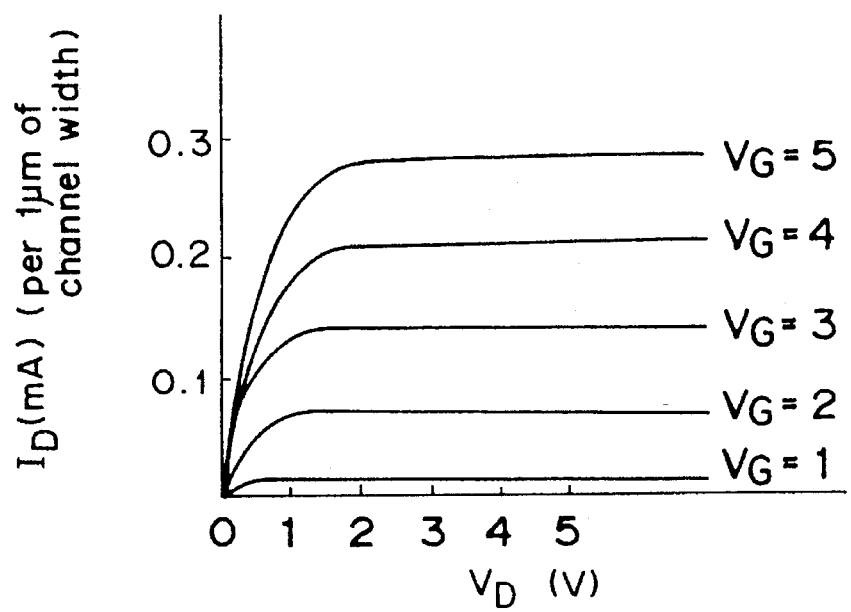
FIGS. 9A, 9B, 9C and 9D are graphs showing the current characteristics of the memory cell MOSFET's in the first and second embodiments.
Figure 9B:
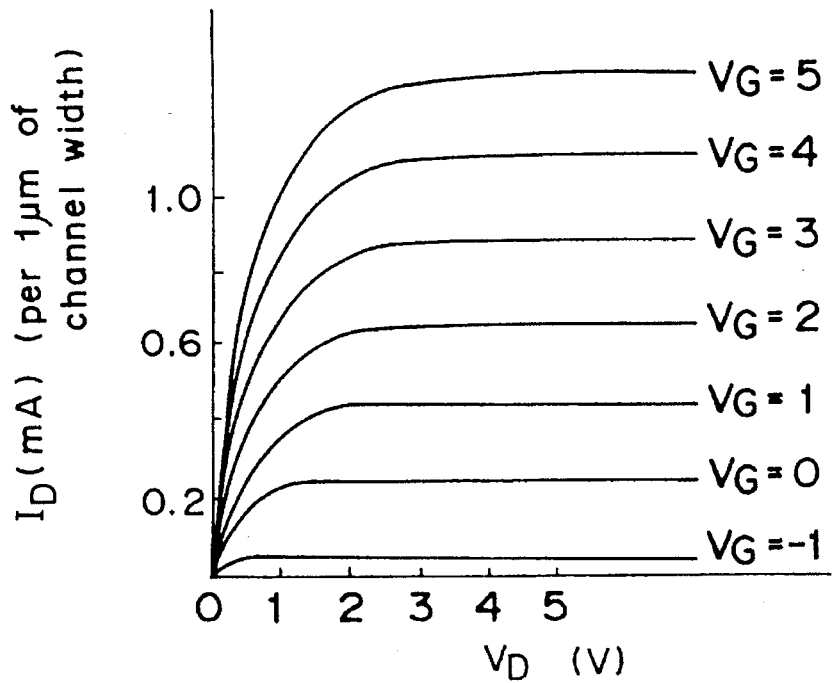
Figure 9C:
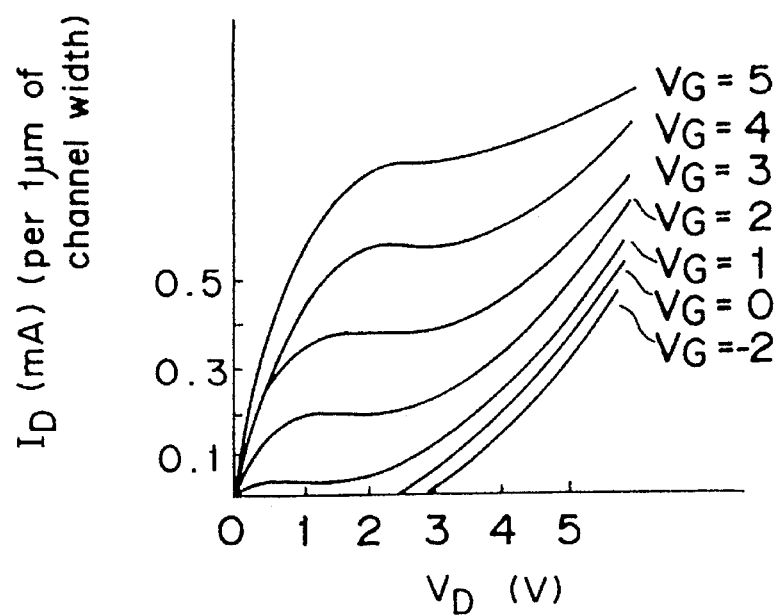
Figure 9D:
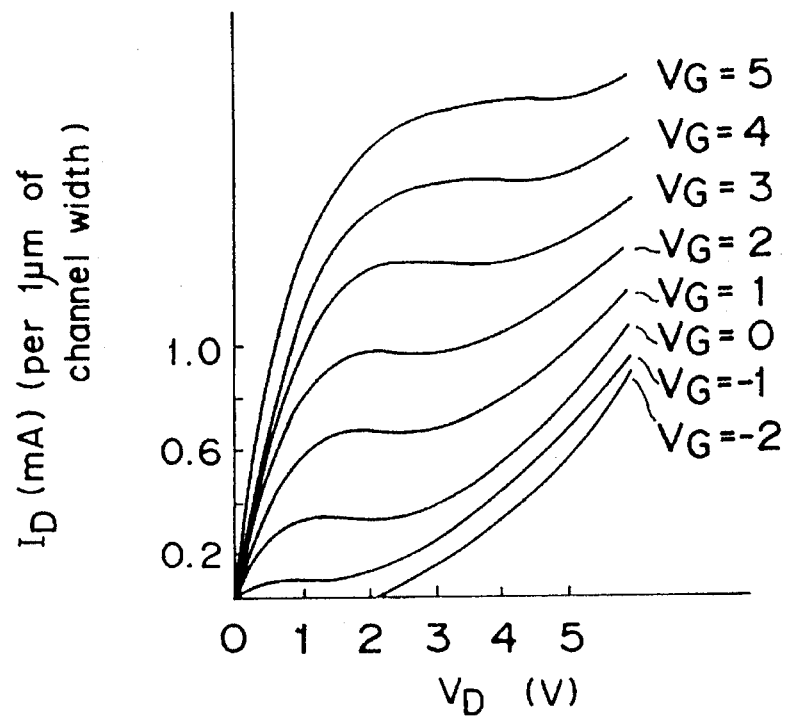

FIG. 8 is a diagram showing the construction of a memory cell group of a read only storage device in accordance with a fourth embodiment of the present invention. The memory cell group has the NOR type structure as in the third embodiment.

Similar to the third embodiment, the read only storage device of this embodiment has an array of memory cells each of which has a MOS transistor and, as shown in FIG. 8, four MOSFET's TRM, TRN, TRO, and TRP, all of which are enhancement type transistors constitute a memory cell group. The MOSFET TRM has a long channel length and a high threshold voltage. The MOSFET TRN has the long channel length and a low threshold voltage. The MOSFET TRO has a short channel length and the high threshold voltage. The MOSFET TRP has the short channel length and the low threshold voltage.

In the figure, a dotted area IR is an implant region where an impurity is implanted to provide the high threshold voltage, and a reference number 70 indicates an implant region serving as part of the source or drain region of the transistors TRO and TRP.

The MOSFET's TRM–TRP have the same current characteristics as those of the MOSFET's TRI–TRL of the third embodiment, which are shown in FIGS. 10A, 10B, 10C, and 10D, respectively. That is, in the long-channel high-threshold voltage transistor TRM, no current flows when the gate voltage $V_G$ is not greater than the power voltage (5 V in this embodiment), regardless of the bias condition $V_D$ between the source and the drain. In the long-channel low-threshold voltage transistor TRN, a current flows when the gate voltage $V_G$ is at a high level, regardless of the potential difference $V_D$ between the source and the drain. In the short-channel high-threshold transistor TRO, a current flows when the potential difference $V_D$ between the source and the drain is higher than a certain level (about 4 V), regardless of the gate voltage $V_G$. In the short-channel low-threshold transistor TRP, a current flows when the gate voltage $V_G$ is at a high level or the potential difference $V_D$ between the source and the drain is higher than a certain level (between 4 V and 5 V).

When the gate voltage $V_G$ is 0 V and the potential difference $V_D$ between the source and the drain is lower than a specified level, no current flows in any memory cell MOSFET.

Table 4 shows a relation between the ON/OFF state of each MOSFET and the bias conditions for the word line WL and the bit line BL.

TABLE 4

| | | $V_G = 0$ V $V_D = 2$ V | $V_G = 5$ V $V_D = 2$ V | $V_G = 2$ V $V_D = 5$ V |
|---|---|---|---|---|
| TRM: | High threshold voltage long channel | OFF | OFF | OFF |
| TRN: | Low threshold voltage long channel | OFF | ON | OFF |
| TRO: | High threshold voltage short channel | OFF | OFF | ON |
| TRP: | Low threshold voltage short channel | OFF | ON | ON |

Although the exemplified voltages are based on a power voltage of 5 V in Table 4, it is preferred to apply optimum voltages according to process conditions and device characteristics.

As is evident from Table 4, the ON/OFF state of each MOSFET can be controlled according to the bias conditions for the word line and the bit line.

Reading of storage data from the read only storage device can be executed in the same manner as in the third embodiment, and further description on the read method is omitted here.

The present read only storage device can be manufactured in a manner similar to that for the second embodiment manufacture shown in FIGS. 13A–13H, although the layout of the memory cell transistors, impurities to be used, implantation conditions, etc. are different. The following description is made only with respect to the ion implantation steps for the present embodiment, using FIGS. 13B, 13D, 13E and 13F for the sake of convenience.

At an ion implantation step corresponding to that shown in FIG. 13B, boron ions are implanted under the conditions of 20 key and $5\times10^{12}$ cm$^{-2}$ such that n-channel enhancement type transistors are obtained. This is common to the third and fourth embodiments.

At an ion implantation step for processing the source and drain regions 6, which is corresponding to that shown in FIG. 13D, arsenic ions are implanted under the conditions of 50 keV and $2\times10^{15}$ cm$^{-2}$ This step is common to the fabrication processes of the second and fourth embodiment devices.

At an ion implantation step corresponding to that shown in FIG. 13E, boron ions are implanted under the conditions of 60 keV and $7\times10^{13}$ cm$^{-2}$ to raise the threshold voltage.

It is noted that an impurity (boron in the present case) of the same type as that of the impurity of the substrate 1 is used in this ion implantation process to raise the threshold voltage of the enhancement type transistors, unlike the ion implantation step of the second embodiment fabrication shown in FIG. 13E wherein an impurity of the type different from that of the impurity of the substrate 1 is used to lower the threshold voltage and achieve the depletion type transistors.

The step shown in FIG. 13F is common to the second and fourth embodiments. That is, arsenic ions are implanted obliquely under the conditions of 50 key and $2\times10^{15}$ cm$^{-2}$, whereby the implant regions 9 (70 in FIG. 8) constituting part of the source and drain regions are formed.

The read only storage device of this fourth embodiment can offer the same advantages as those of the preceding embodiments.

As is apparent from the above description of the present invention, a plurality of MOSFET's are made to have a plurality of types of channel impurity profile and are formed into the depletion type transistors or the enhancement type transistors, or into the high-threshold transistors or the low-threshold transistors in correspondence with storage data. The plural number of MOSFET's are also made to have a plurality of types of effective channel length and are formed into punch-through devices or non-punch-through devices in correspondence with storage data. The above arrangement allows an increased manufacturing process margin to be achieved. Furthermore, in the read only storage device, one of written data of the MOSFET's in each memory cell can be read according to the bias voltages applied to a selected MOSFET, which allows a high-speed read to be achieved. Furthermore, since write of data is executed after formation of the gate electrodes, the turn-around time for the device fabrication can be shortened.

Fifth embodiment

Figure 14:
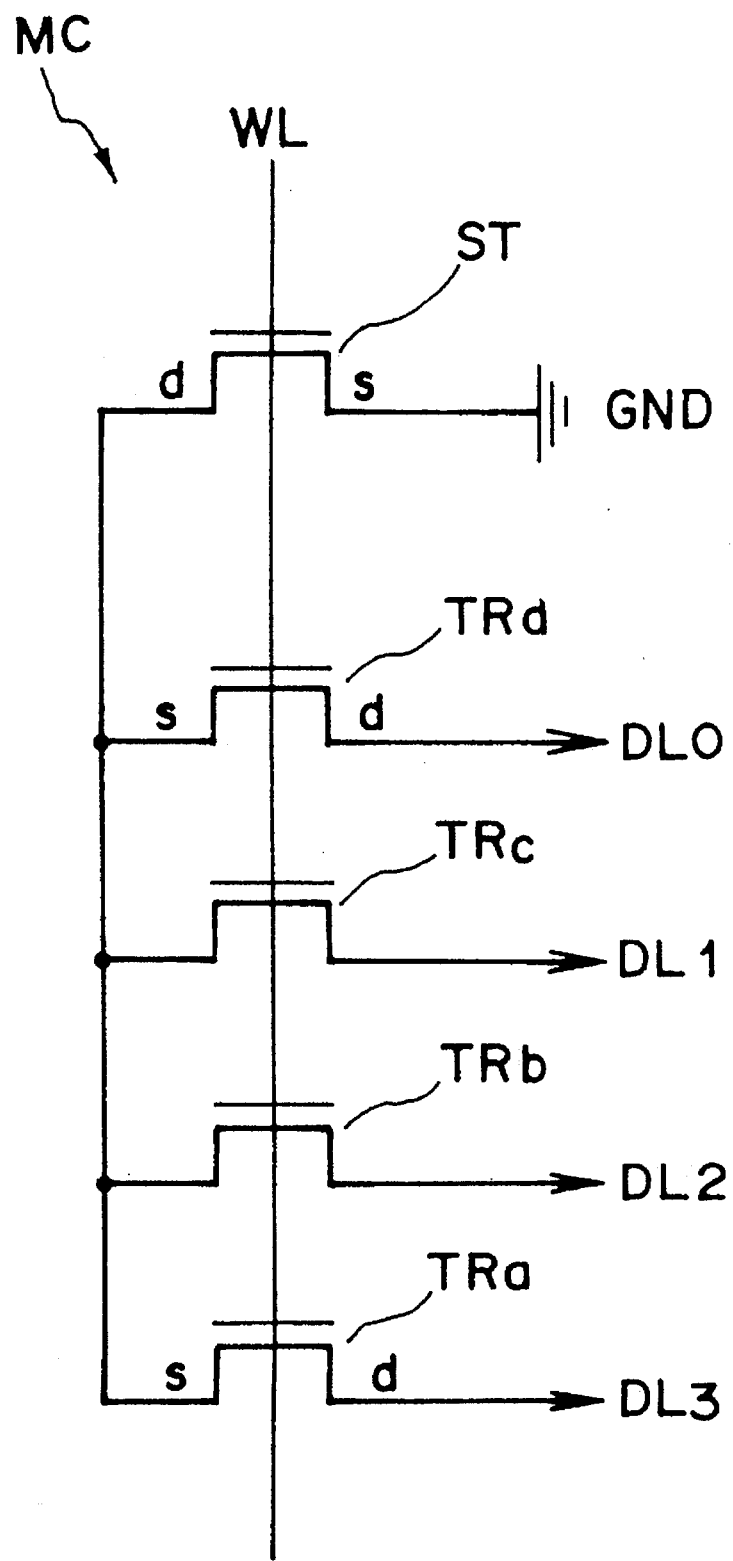
FIG. 14 is an equivalent circuit diagram of a memory cell constituting part of a multivalued read only storage device in accordance with a fifth embodiment of the present invention.

FIG. 14 shows an equivalent circuit of a memory cell MC constituting a part of a multivalued read only storage device in accordance with a fifth embodiment of the present invention. The memory cell group MC includes four different MOSFETs (memory cell transistors) TRa, TRb, TRc, and TRd and one selector transistor ST which are driven by a common word line WL. Each of the memory cell transistors TRa, TRb, TRc, and TRd has a drain d connected respectively to bit lines DL3, DL2, DL1, and DL0. Each of the memory cell transistors TRa, TRb, TRc, and TRd has a source s connected commonly to a drain d of the selector transistor ST. The source s of the selector transistor ST is grounded, that is, connected to a ground line GND. It is noted that the number of transistors per memory cell may be greater than four.

Figure 15:
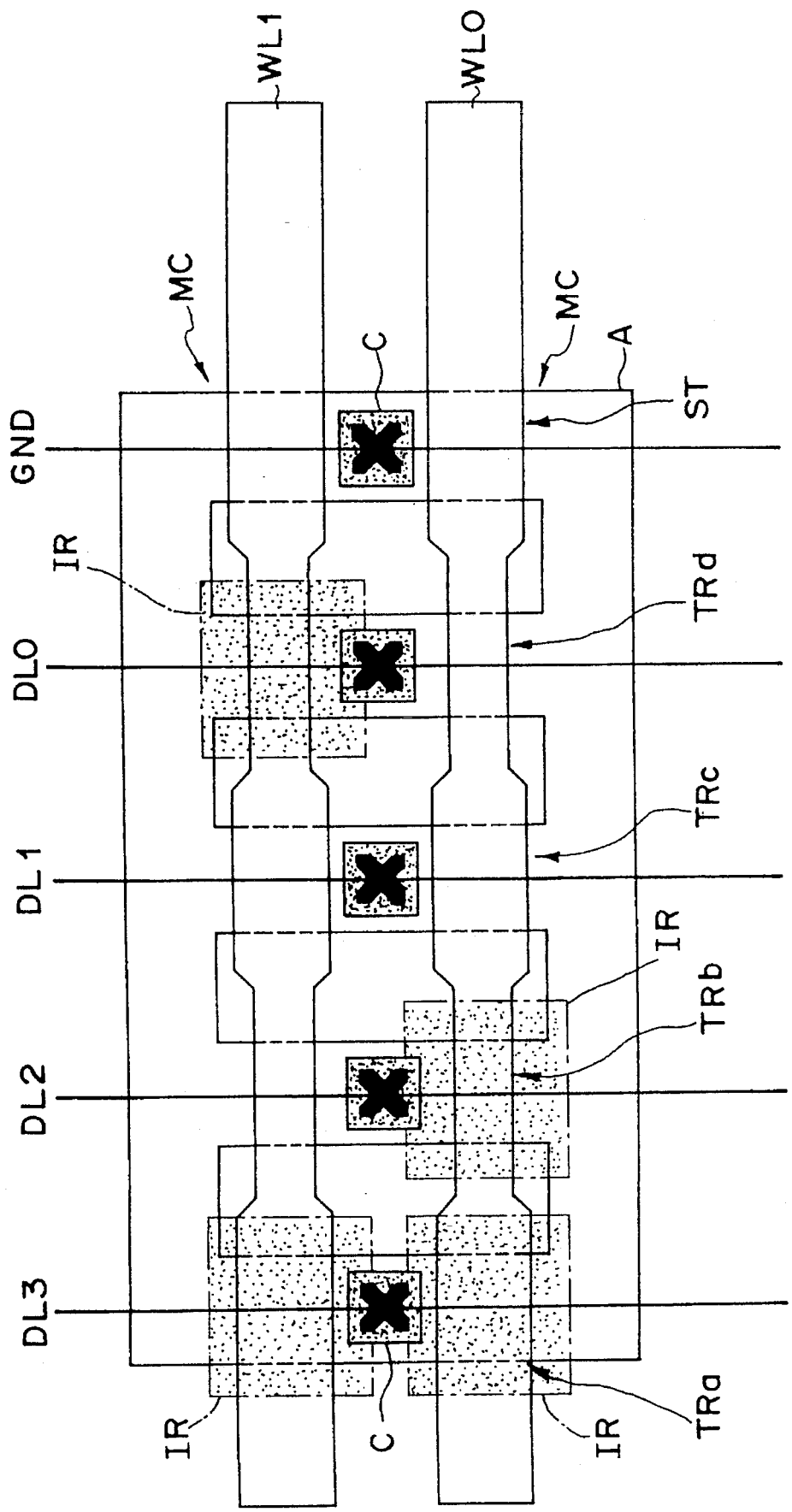
FIG. 15 is a layout pattern of two memory cells in the fifth embodiment.

FIG. 15 shows a layout pattern including the memory cell group MC driven by the word line WL0 and another memory cell group MC driven by the word line WL1. The four different memory cell transistors TRa, TRb, TRc, and TRd are provided by combining two different channel lengths and two different thresholds. For instance, in the memory cell group MC driven by the word line WL0, the transistor TRa has a long channel length and a high threshold, the transistor TRb has a short channel length and the high threshold voltage level, the transistor TRc has the long channel length and a low threshold, and the transistor TRd has the short channel length and the low threshold. Implant regions IR and IR have the same type of impurity concentration as that of the substrate. These ion implantation regions IR are provided for the purpose of increasing the threshold level of the transistors TRa and TRb relative to the threshold level of the transistors TRc and TRd. It is noted that the four different memory cell transistors TRa–TRd in each memory cell group MC are arranged in various patterns. The arrangement pattern is determined in a mask design stage in light of the application of the storage device. In FIG. 15, the reference character A indicates an active region, and the reference character C indicates a contact portion.

The transistors TRa, TRb, TRc, and TRd have the characteristics of the drain current Ids vs. the source-drain voltage Vds (with the gate voltage Vg used as a parameter) as shown in FIGS. 17A, 17B, 17C and 17D, respectively. The characteristics are determined based on a power voltage of 5 V. With these characteristics, when the bias voltages (Vg, Vd)=(0 V, 0 V), (5 V, 2 V), or (2 V, 5 V) are applied to the transistors TRa, TRb, TRc, and TRd, the transistors exhibit the ON/OFF conditions shown in Table 5.

TABLE 5

|  | $V_g = 0$ V<br>$V_d = 2$ V | $V_g = 5$ V<br>$V_d = 2$ V | $V_g = 2$ V<br>$V_d = 5$ V |
|---|---|---|---|
| TRa: High threshold voltage long channel | OFF | OFF | OFF |
| TRb: High threshold voltage short channel | OFF | OFF | ON |
| TRc: Low threshold voltage long channel | OFF | ON | OFF |
| TRd: Low threshold voltage short channel | OFF | ON | ON |

That is, the transistor TRa does not turn on irrespective of the bias conditions Vg, Vd. The transistor TRb turns on irrespective of the bias Vg if the source-drain voltage Vds is over 2–3 volts. The transistor TRc turns on when Vg is at a high level (5 V). The transistor TRd turns on when Vg is at a high level or Vds is over 2–3 V.

Figure 16:
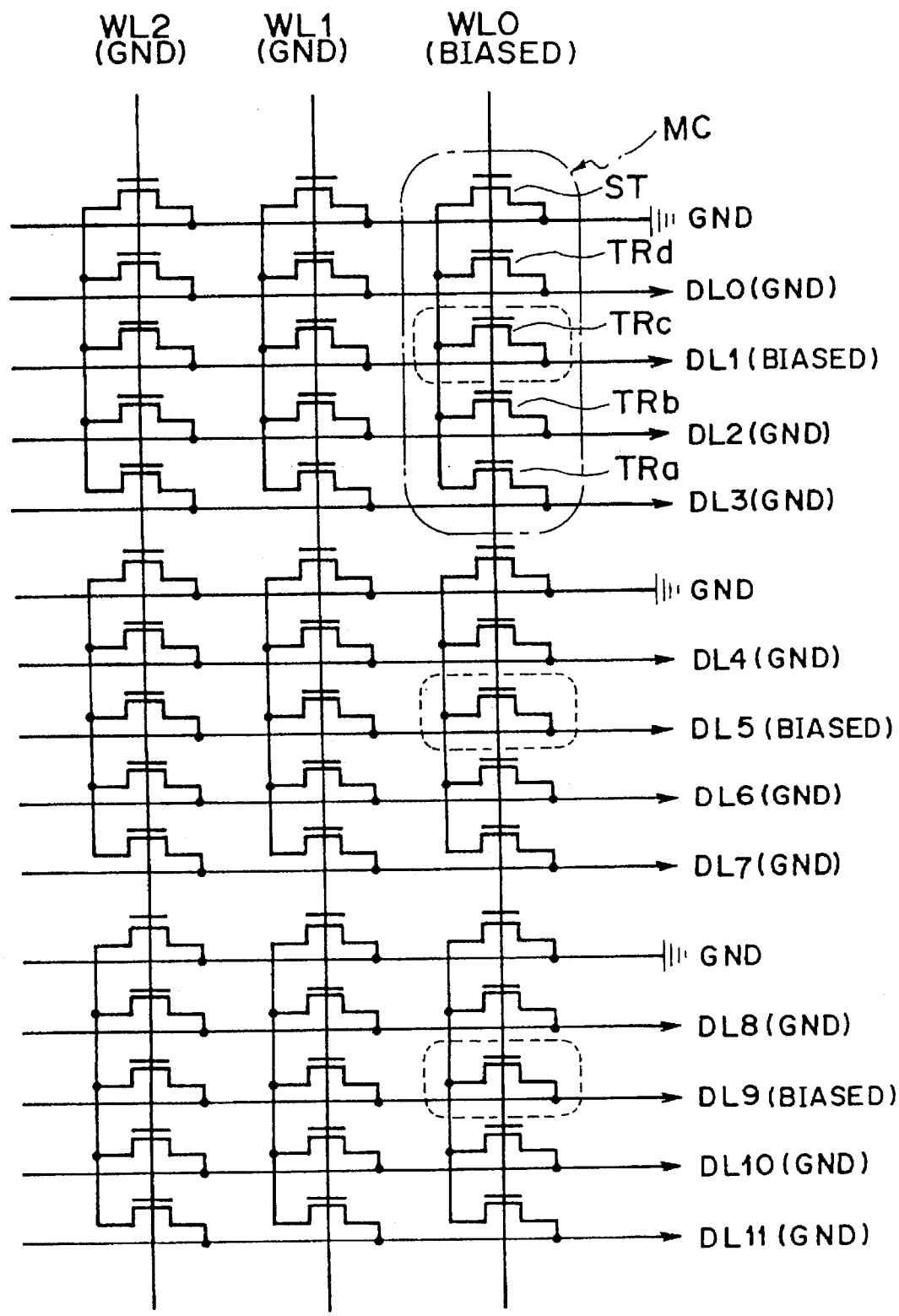
FIG. 16 is a circuit diagram of a memory cell array in the fifth embodiment.
Figure 17A:
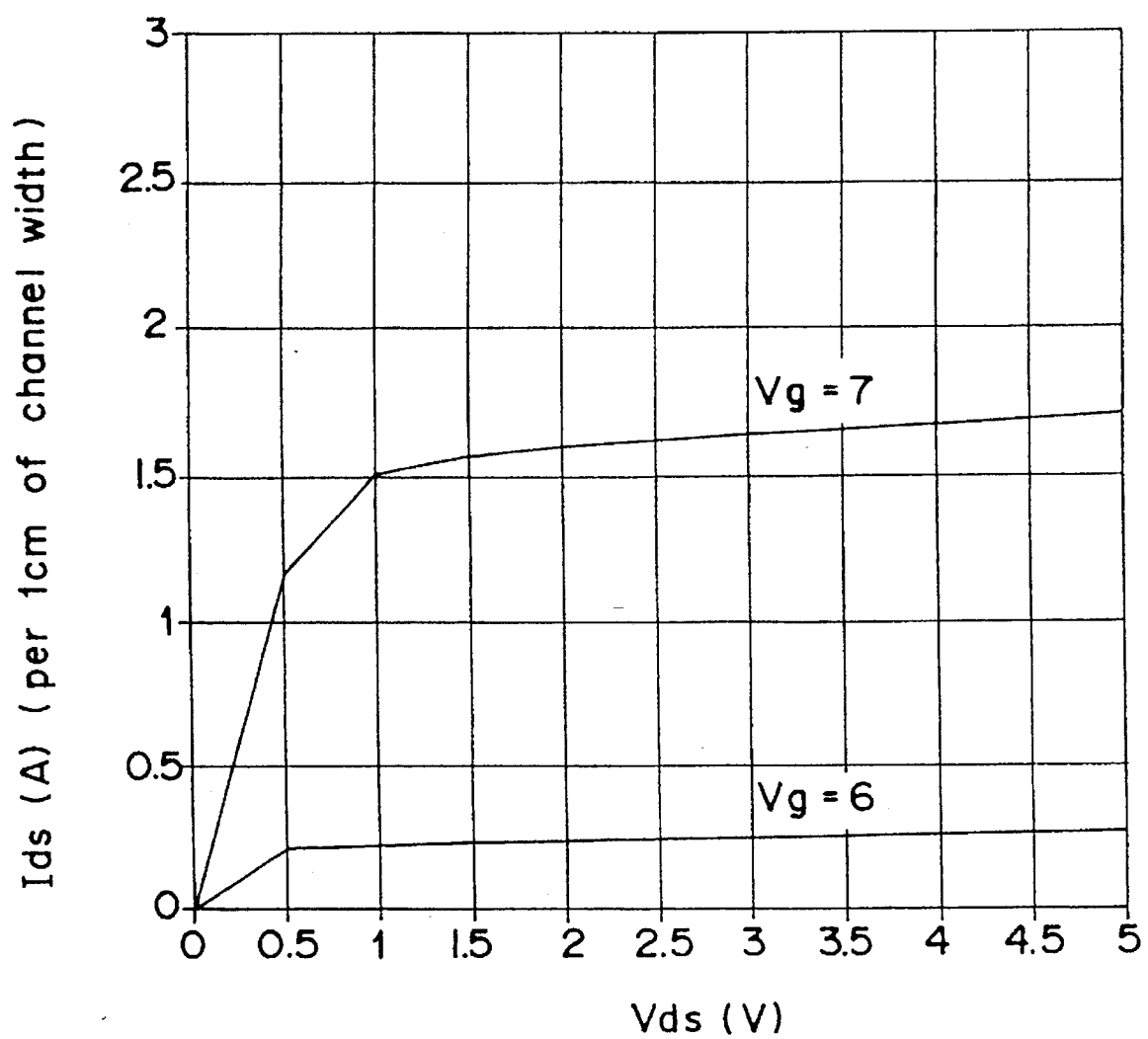
FIGS. 17A, 17B, 17C and 17D are graphs showing the current characteristics of the memory cell MOSFET's in the fifth embodiment.
Figure 17B:
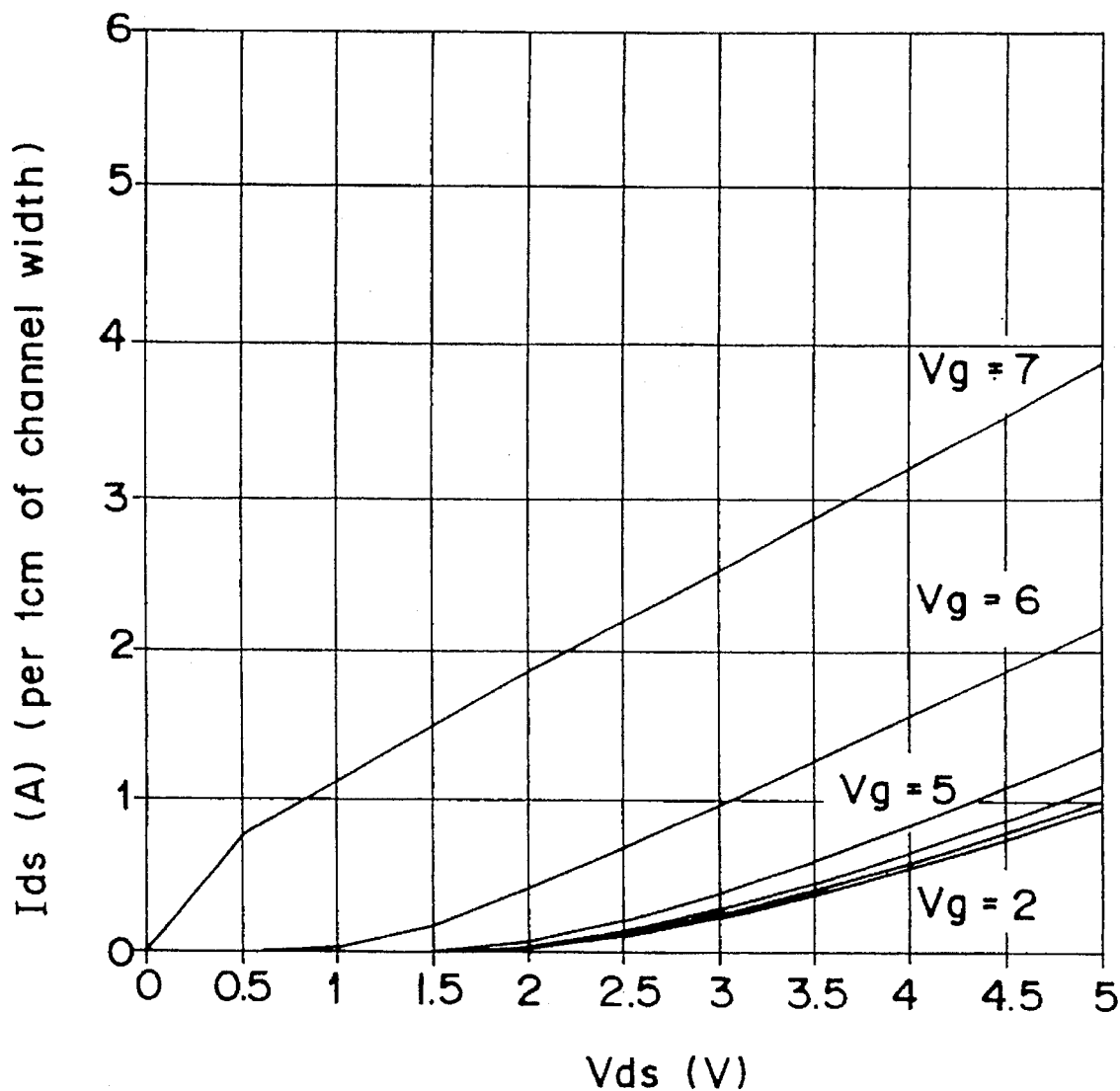
Figure 17C:
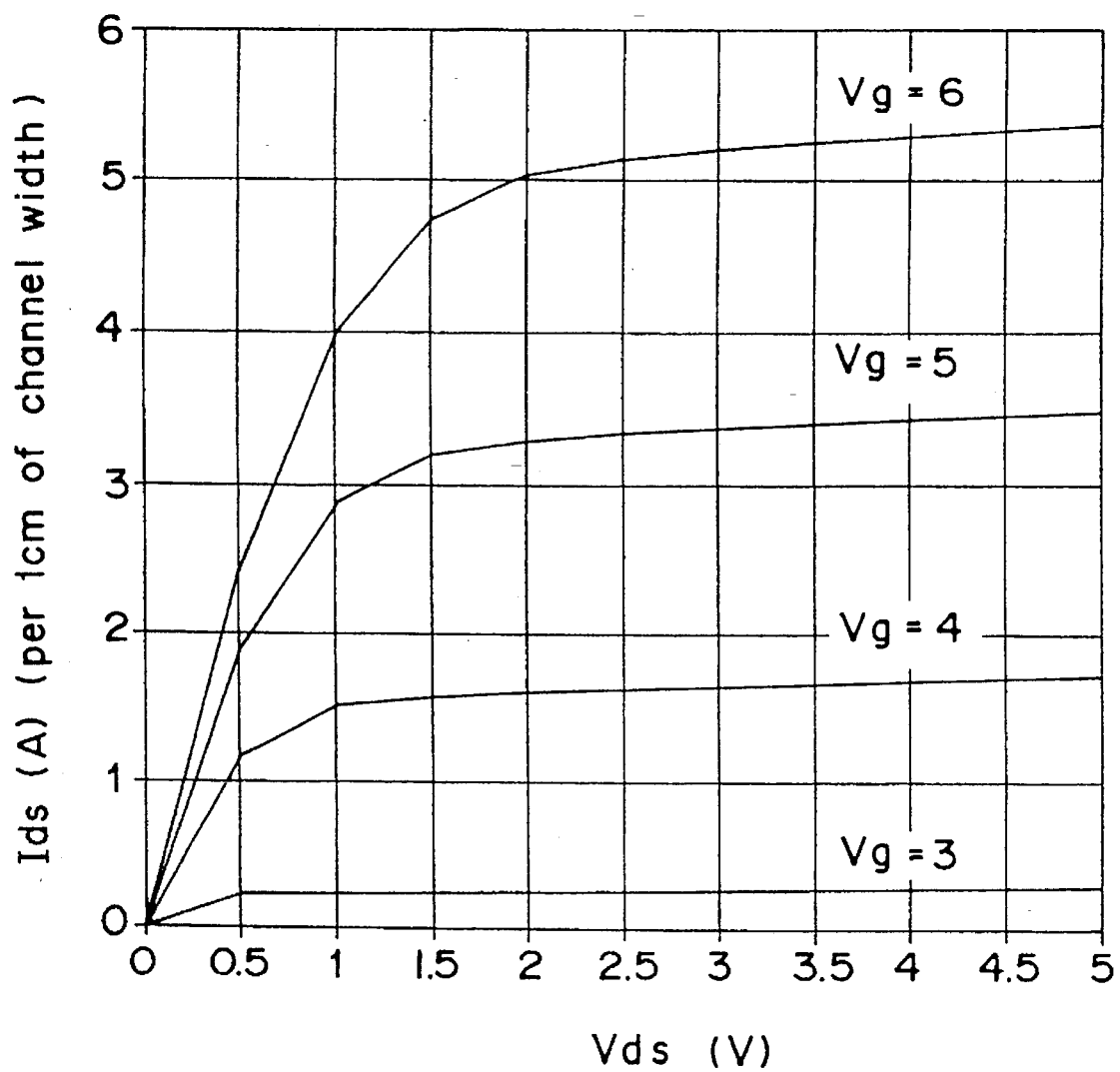
Figure 17D:
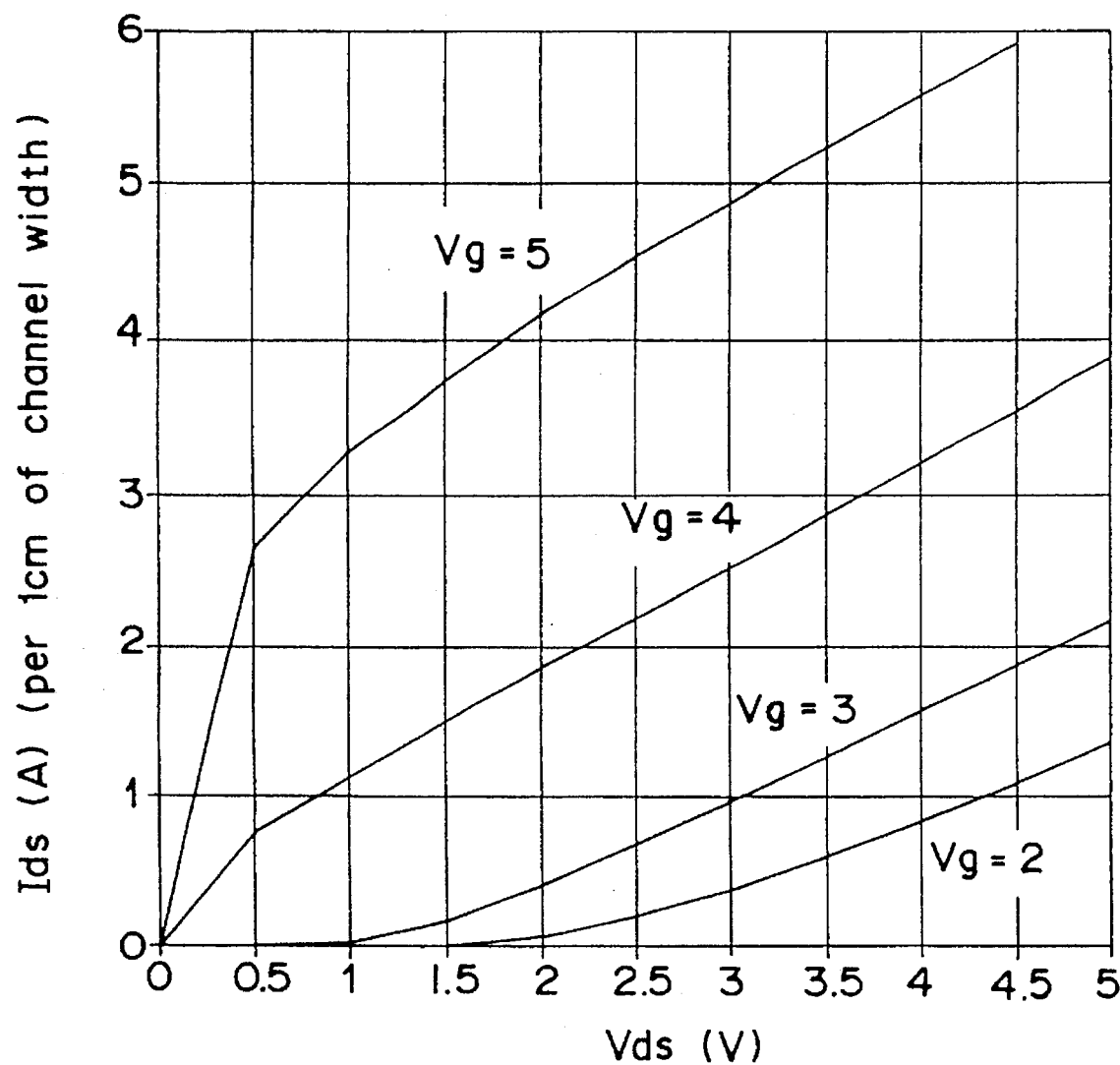

Referring to FIG. 16, the memory cell array of the present multivalued read only storage device is constructed by arranging a plurality of the memory cell group MC in matrix. A memory cell group MC constituted of a set of the transistors is provided at intersections of the word line WL0 and the ground line GND and four bit lines DL0, ..., DL3. Similarly, other memory cell group MC are provided at intersections of the word line WL0 and another ground line GND and four bit lines DL4, ..., DL7, and at intersections of the word line WL0 and yet another grounding line GND and four bit lines DL8, ..., DL11. In the same manner as described above, memory cell group MC are provided at each of intersections of word lines WL1 and WL2, and ground lines GND, bit lines DL0, ..., DL3, bit lines DL4, ..., DL7, and bit lines DL8, ..., DL11.

The above-mentioned multivalued read only storage device is driven in the following manner by a read circuit having the same block construction as shown in FIG. 11.

(1) When an input address signal "Sa" transits, the address decoder 101 analyzes the signal transition and provides a signal "Sr" representing a row address and a signal "Sc" representing a column address to the word line driver 103 and the bit line selector 104 respectively while outputting a signal made of a given bit "Sb" of the input address signal Sa to the bias condition setting section 102. The signal of the given bit Sb indicates the bias conditions (values of Vg and Vd) to be applied to a selected word line and a selected bit line. The given bit used for the bias conditions setting can be any one of the upper or lower bits constituting the address signal, although use of the most significant bit or the least significant bit is most practical. In the bias condition setting section 102, the bias conditions (values of Vg and Vd) to be applied to a selected word line WL and a selected bit line are set based on the signal received from the decoder 101. Then the bias condition setting section 102 outputs signals Bw and Bb representing the bias conditions to the word line driver 103 and the bit line selector 104, respectively.

(2) Based on the signals Bw and Bb received from the bias condition setting section 102, the word line driver 103 and the bit line selector 104 apply bias voltages Vg and Vd to a selected memory cell transistor in the memory cell array 106. In more detail, one of the word lines WL0, WL1, WL2, ... in the memory cell array is selected as shown in FIG. 16. In the present example, the bias voltage Vg (≠0) is applied only to the word line WL0, and the other word lines WL1, WL2, ... are all maintained at the ground potential GND. At this mime, the selector transistors ST driven by the word line WL0 are turned on, while the selector transistors driven by the word lines WL1, WL2, . . . are turned off.

(3) Regarding the bit lines, only one bit line is selected per a memory cell groups MC. In the present example shown in FIG. 16, the bias voltage Vd is applied only to the bit line DL1, and the other bit lines DL0, DL2, and DL3 in the memory cell groups are maintained at the ground potential GND. Instead of maintaining the other bit lines at the ground potential GND, they may be maintained at a low electric potential which does not cause the punch-through phenomenon. Accordingly, the source-drain voltage Vds is applied only to the transistor TRc among the memory cell transistors TRa, TRb, TRc, and TRd of the memory cell groups MC via the selector transistor ST that is in the ON state due to a potential difference between the bit line DL1 and the ground line GND. In other words, the memory cell transistor TRc is selected. At this time, other memory cell groups transistors also connected to the selected bit line DL1 but designed to be driven by the other word lines WL1, WL2, . . . are not turned on even when the bit line DL1 has any value of electric potential because the selector transistors ST in the corresponding memory cells are in an OFF state. Therefore, only the memory cell transistor TRc driven by the word line WL0 is selected among from the memory cell group transistors connected to the selected bit line DL1.

It is noted that a plurality of bit lines may be selected so long as two or more bit lines per memory cell group are not selected at the same time. For instance, when the bit line DL1 is selected, the bit lines DL5 and DL9 connected with other memory cells may be selected at the same time, as shown in FIG. 16.

(4) A signal taken out of the memory cell array 106 through the bit line DL1 is compared with the reference voltage Vref in the differential amplifier 105, as shown in FIG. 11. With this operation, one of two types of information written in the memory cell transistor, i.e., one of the information related to the threshold voltage and the information related to the channel length is read as data.

In the multivalued read only storage device as described above, since a signal taken out of the memory cell array 106 through a selected the bit line is compared with only one reference voltage Vref, high-speed read is achieved in comparison with the conventional devices wherein a signal taken out of the memory cell array is compared with a plurality of reference values. When a plurality of bit lines DL1, DL5, DL9, . . . , one per memory cell group, are selected, a plurality of data can be read in parallel. This leads to reduction of the read time per bit, and hence further increase of the read speed.

Figure 1:
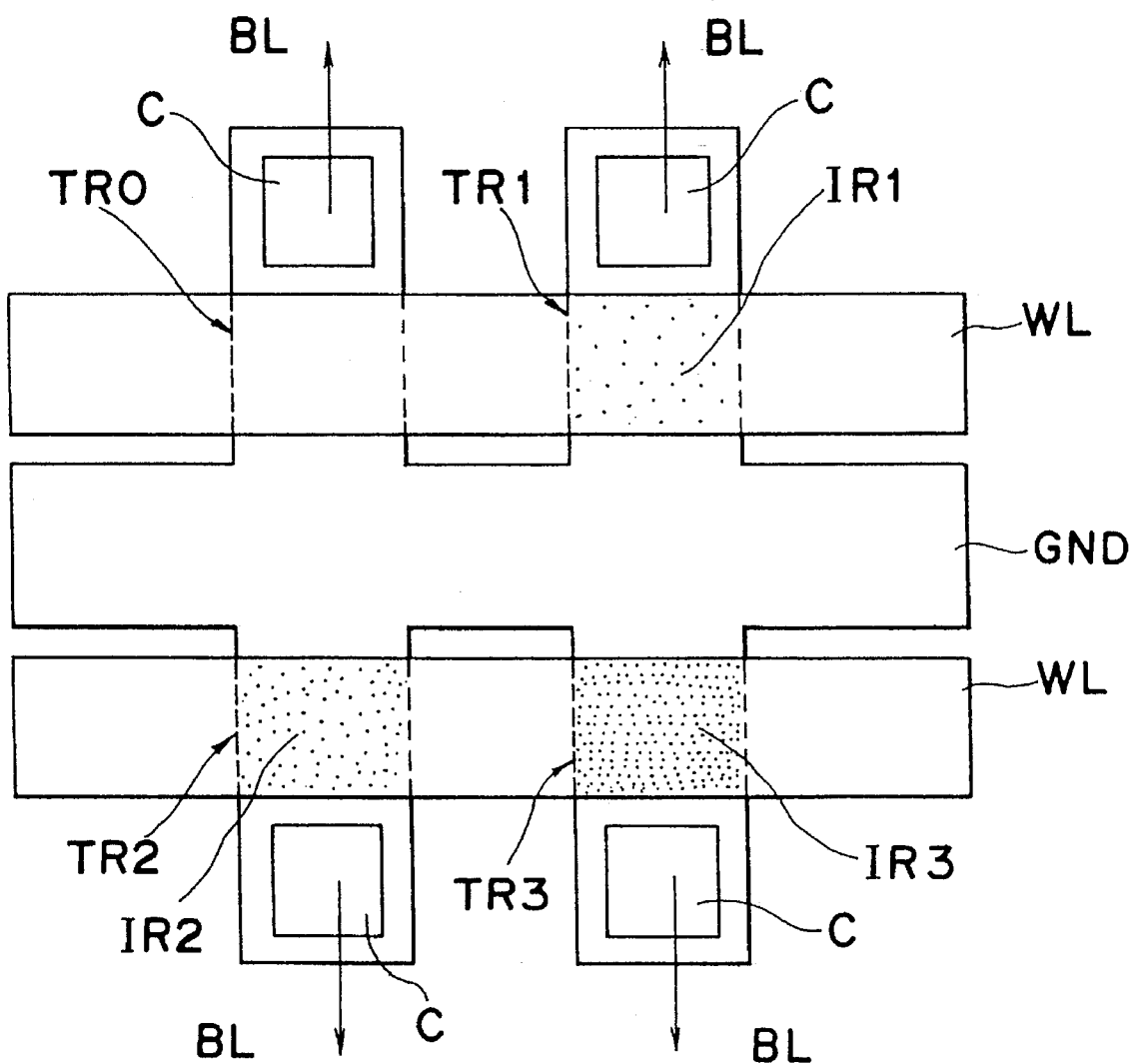
FIG. 1 is a diagram showing the construction of a memory cell of a prior art read only storage device.
Figure 2:
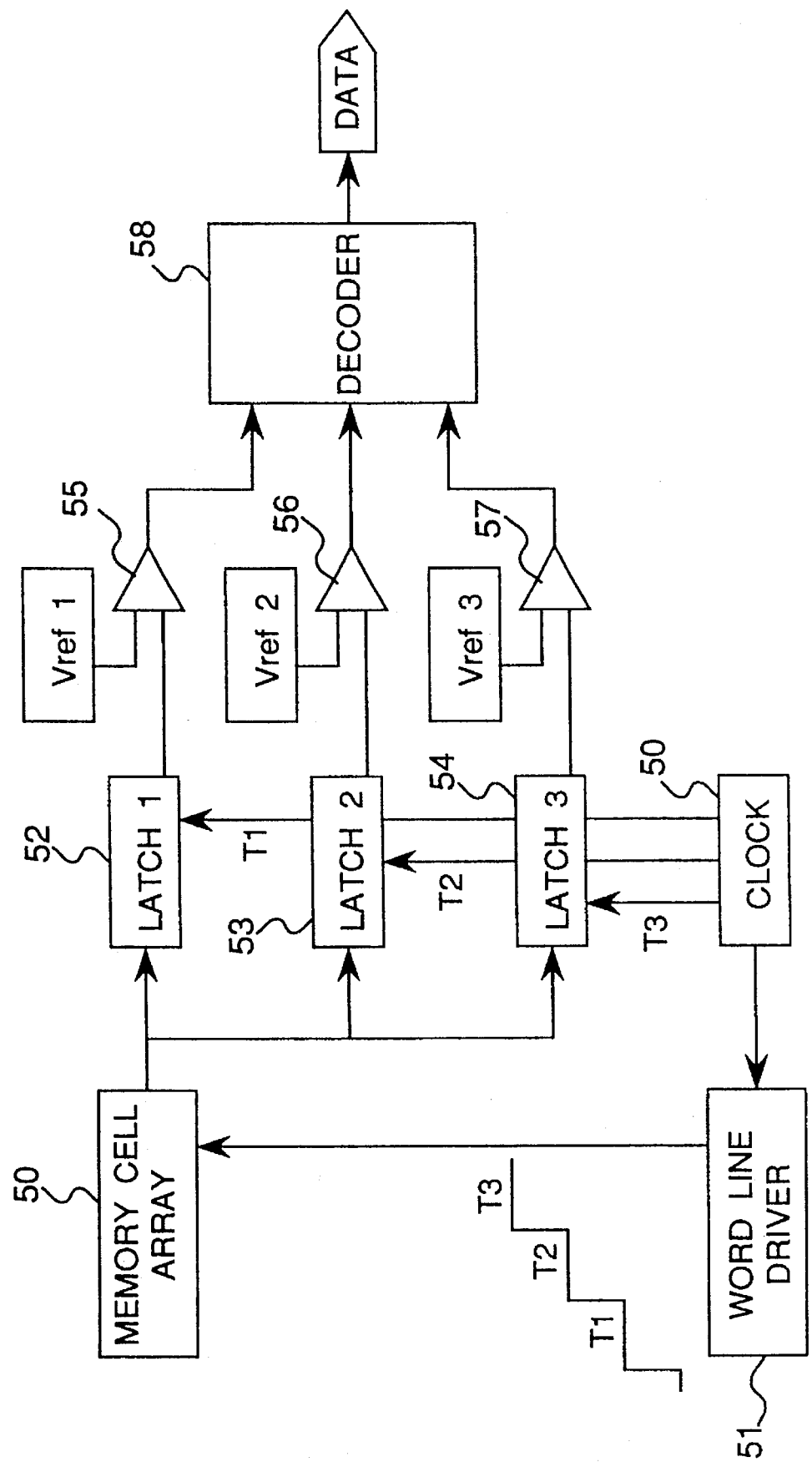
FIG. 2 is a block diagram of a read circuit for driving the read only storage device of FIG. 1.
Figure 3:
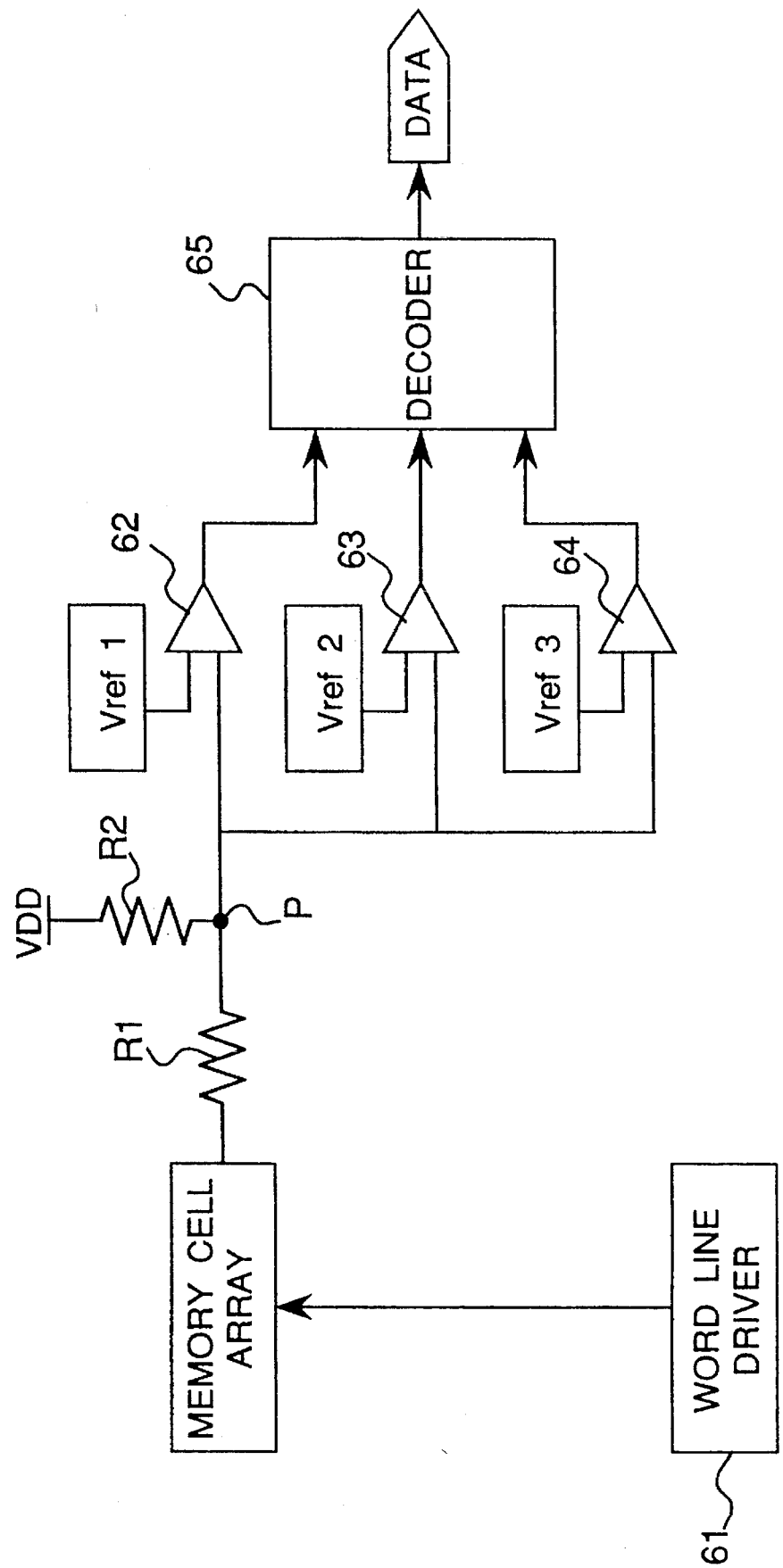
FIG. 3 is a block diagram of another read circuit for driving the read only storage device of FIG. 1.
Figure 4:
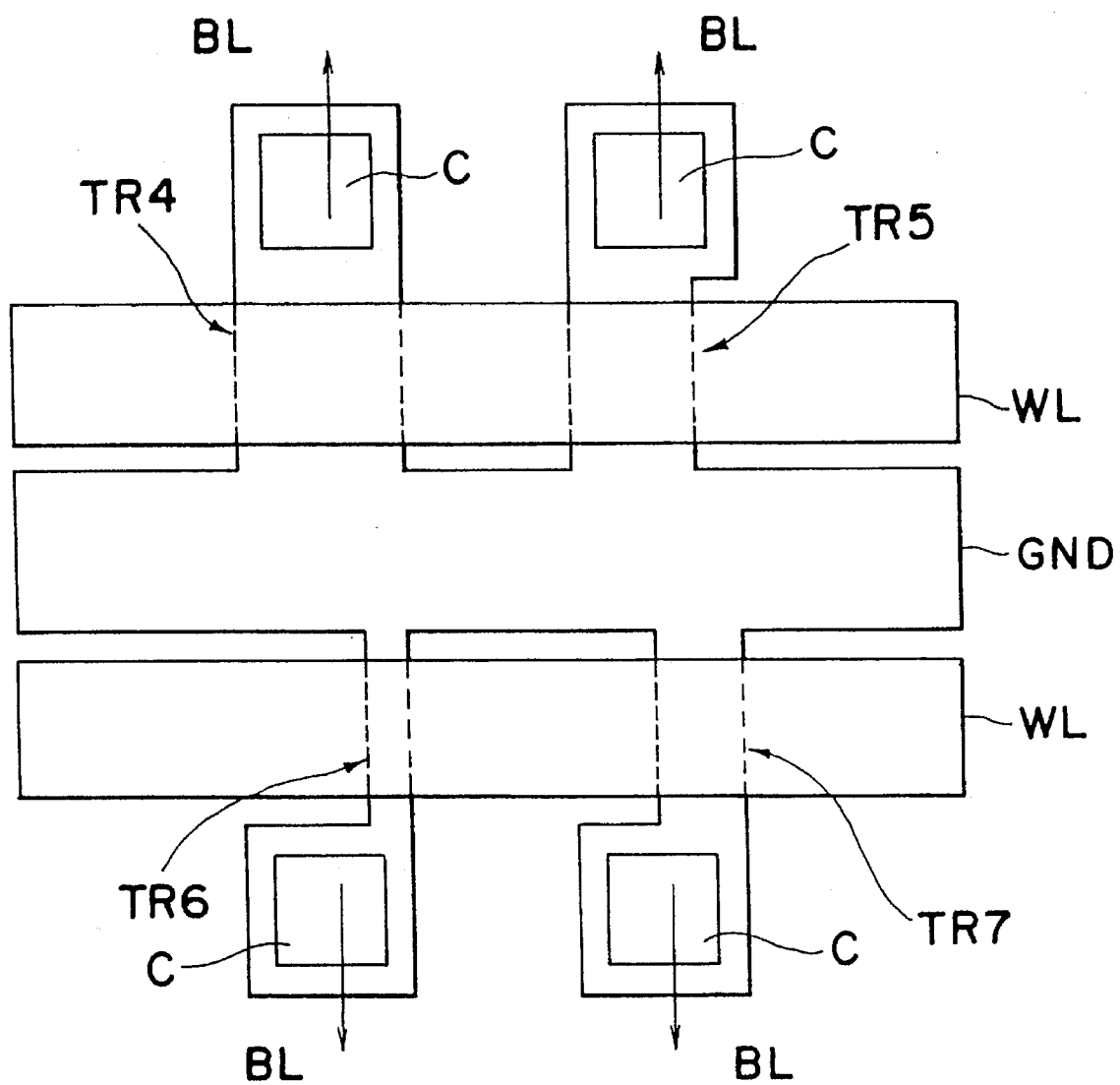
FIG. 4 is a diagram showing the construction of a memory cell of a further prior art read only storage device, which can be driven by the circuit shown in FIG. 3.

In the present multivalued read only storage device, the four types of memory cell transistors in each memory cell group are specified by two types of channel length and two types of threshold voltage in combination, which means that the device has fewer threshold voltages in comparison with the case (FIG. 1) where four types of memory cell transistors are provided through variation of only the threshold voltage. Therefore, the device of the invention can be manufactured with an increased process margin.

Furthermore, in the multivalued read only storage device, each memory cell group has only one selector transistor ST for the transistors in the memory cell group. Therefore, the possible increase in size of the device can be suppressed in comparison with a case where one selector transistor is provided for every memory cell transistor in each memory cell group. This feature allows the device to be put into practical use.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A multivalued read only data storage device, wherein memory cells arrayed in matrix form at intersections of word lines and bit lines each comprise a metal oxide semiconductor (MOS) transistor which has a combination of one of a plurality of predetermined channel impurity profiles and one of a plurality of predetermined effective channel lengths, each combination corresponding to a different one of said multivalued data, wherein the channel impurity profile and the effective channel length of each MOS transistor is independent of each other MOS transistor and wherein the combinations of the channel impurity profile and the effective channel length respectively represent one of at least four different data values.

2. The multivalued read only storage device of claim 1, wherein the plurality of effective channel lengths are classified into the following two groups: a first group that causes a punch-through phenomenon in the MOS transistors and a second group that does not cause the punch-through phenomenon in the MOS transistors.

3. The multivalued read only storage device of claim 2, wherein the plurality of channel impurity profiles are classified into the following two groups: a first group that provides depletion type MOS transistors and a second group that provides enhancement type MOS transistors.

4. The multivalued read only storage device of claim 2, wherein all of the plurality of channel impurity profiles provide enhancement type MOS transistors and are classified into the following two groups: a first group that provides the MOS transistors with a first threshold and a second group that provides the MOS transistors with a second threshold lower than the first threshold.

5. The multivalued read only storage device of claim 4, wherein a plurality of MOS transistors constitute a memory cell group and are connected in parallel.

6. The multivalued read only storage device of claim 3, wherein a plurality of MOS transistors constitute a memory cell group and are connected in series.

7. The multivalued read only storage device of claim 5, wherein each memory cell group further comprises a selector transistor for selecting the memory cell group and the plurality of MOS transistors and the selector transistor are driven by a common word line, wherein one terminal of each of the MOS transistors is connected to a different bit line and the other terminal of each of the MOS transistors is connected to a terminal of the selector transistor, the other terminal of the selector transistor being grounded.

8. The multivalued read only storage device of claim 7, which is driven by selecting one of the word lines and selecting one bit line per memory cell group.

9. The multivalued read only storage device of claim 8, wherein each memory cell group has four MOS transistors.

10. The multivalued read only storage device of claim 6, wherein each memory cell group further comprises a selector transistor for selecting the memory cell group and the selector transistor is driven by a select line, wherein one terminal of the selector transistor is connected to a bit line and the other terminal of the selector transistor is connected to a terminal of the plurality of MOS transistors, the other terminal of the plurality of MOS transistors being grounded.

11. The multivalued read only storage device of claim 10, which is driven by selecting one of the word lines per memory cell group and selecting the select line.

12. The multivalued read only storage device of claim 11, wherein each memory cell group has four MOS transistors.

* * * * *